(12) United States Patent
Grant

(10) Patent No.: US 12,489,439 B1
(45) Date of Patent: Dec. 2, 2025

(54) POWER SWITCH HAVING OFF INDICATION AND METHOD OF COORDINATING

(71) Applicant: Apogee Semiconductor, Inc., Plano, TX (US)

(72) Inventor: David A. Grant, Dallas, TX (US)

(73) Assignee: Apogee Semiconductor, Inc., Plano, TX (US)

(*) Notice: Subject to any disclaimer, the term of this patent is extended or adjusted under 35 U.S.C. 154(b) by 0 days.

(21) Appl. No.: 19/194,199

(22) Filed: Apr. 30, 2025

(51) Int. Cl.
  *H03K 17/18*    (2006.01)
  *H03K 17/0812*  (2006.01)
  *H03K 17/08*    (2006.01)

(52) U.S. Cl.
  CPC ....... *H03K 17/18* (2013.01); *H03K 17/08122* (2013.01); *H03K 2017/0806* (2013.01); *H03K 2217/0054* (2013.01); *H03K 2217/0063* (2013.01)

(58) Field of Classification Search
  CPC ........ H02M 1/32; H02M 1/088; H02M 3/157; H02M 3/158; H03K 17/18; H03K 17/08122; H03K 2017/0806; H03K 2217/0054; H03K 2217/0063
  USPC .................................. 361/86–87, 93.7–93.9
  See application file for complete search history.

(56) References Cited

U.S. PATENT DOCUMENTS

| | | |
|---|---|---|
| 6,891,425 B1 | 5/2005 | Huynh |
| 8,258,829 B2 | 9/2012 | Komaki |
| 12,021,535 B1 * | 6/2024 | Tang ..................... H03K 5/2472 |
| 2017/0303369 A1 | 10/2017 | Thosteson |
| 2023/0375599 A1 * | 11/2023 | Pidutti ................ H02M 1/0009 |
| 2024/0022241 A1 * | 1/2024 | Huang ..................... H03K 7/08 |
| 2025/0007390 A1 * | 1/2025 | El-Markhi ............ H02M 1/342 |
| 2025/0116728 A1 * | 4/2025 | R ...................... H02M 3/33576 |

OTHER PUBLICATIONS

Toshiba, Basics of Load Switch ICs, Application Note, Mar. 26, 2021. https://toshiba.semicon-storage.com/info/application_note_en_20210326_AKX00144.pdf?did=13765.

Toshiba, Overcurrent protection function and reverse current prevention function of the load switch IC, Application Note, Mar. 26, 2021. https://toshiba.semicon-storage.com/info/application_note_en_20210326_AKX00314.pdf?did=68579&utm_source=PDF_AN&utm_medium=content&utm_campaign=x34_jp_x342_SRC_SSL0004-ANE.

(Continued)

*Primary Examiner* — Danny Nguyen
(74) *Attorney, Agent, or Firm* — Gregory A. Magel

(57) ABSTRACT

A power switch includes a power device connecting a supply input to an output, and a power switch controller comprising a gate control circuit that turns the power device on and off in response to a command signal and a decision circuit that produces an OFF signal indicating when the power device is fully off. The power device may be integrated or separate from the power switch controller. The gate control circuit may accept one or more enable signals that must be active to turn on the power device, so that OFF signals and enable inputs of multiple power switches can be interconnected to facilitate break-before-make operation using minimal additional circuitry. Coordinated systems of power switches connecting one or more power supplies to one or more loads and methods of coordinating systems of power switches having OFF indication are also provided.

30 Claims, 14 Drawing Sheets

(56) References Cited

OTHER PUBLICATIONS

Patoka, Fundamentals of power system ORing, EETimes online, Mar. 21, 2007. https://www.eetimes.com/fundamentals-of-power-system-oring/.
Texas Instruments, Basics of Ideal Diodes, Application Note, Oct. 2021. https://www.ti.com/lit/an/slvae57b/slvae57b.pdf.

* cited by examiner

POWER SWITCH HAVING OFF INDICATION AND METHOD OF COORDINATING

BACKGROUND OF THE INVENTION

1. Field of the Invention

The present invention relates generally to integrated circuits, and, more particularly, to power management integrated circuits.

2. Description of the Related Art

Power management integrated circuits (ICs) are used in a wide variety of commercial and military applications, to optimize power consumption and/or to prevent catastrophic events, and find use in many types of systems, from handheld devices to automotive and aerospace vehicles. One type of power management circuit is a power switch (also called a load switch) that is used in systems having power architectures requiring the connection of one or more power supplies to one or more loads. Among other things, power switches can be used to enable and disable high-dissipation loads such as heaters to lower power consumption, or to isolate faults such as short circuits. Connecting a selection of multiple supplies to a load, sometimes referred to as power supply ORing, is done to enable redundant architectures in high-reliability systems such as servers, telecom switches, or space systems, and is also employed in battery-powered portable devices having dc power adapters. Power switches may be used to switch between primary supplies and backup supplies to implement redundancy, or between different supplies in order to change voltages for different functions, or to progressively enable multiple supplies in order to sequence startup in a complicated system. In some high-reliability applications, multiple loads may be powered one at a time from a single power supply (cold-sparing the load), with idle loads disconnected in order minimize power consumption. Additional features such as inrush current limiting and slow-start, as well as reverse current protection and other fault protection functions, may also be included in a power switch IC.

The power device in a power switch is typically a high-side semiconductor switch used as a pass element connected in series between a power supply and a load. Since it is desirable to minimize the voltage drop and power dissipation in the pass element, a low-on-resistance MOSFET is frequently used as the power device. In some applications, an integrated circuit implementing power switch functions drives an external power device optimized for high-voltage and/or high-current operation, in which case this IC may be referred to as a power switch controller. However, if supply voltages and power dissipation capabilities permit, a power device can be fabricated on the same IC substrate as the power switch controller circuitry. Integrating the power device offers several advantages, such as enhanced monitoring of temperature and current in the power device, lower inductance and faster switching, in addition to reduced parts count and higher reliability.

In applications where multiple power supplies can be connected to the same output node, it is necessary to ensure "break-before-make" operation, i.e., that no more than one power switch is on at the same time, in order to avoid current flowing from one power supply to another, where a reverse current flows into the lower-voltage supply. Even with power supplies nominally designed for the same voltage, small voltage differences between the separate supplies can exist due to component and temperature variations, leading to reverse currents if their outputs are connected. Since the pass element power devices have low on resistance, even small voltage differences can result in significant reverse currents flowing between supplies instead of into an intended load if one switch is turned on when another is not completely off. Since turn-on and even turn-off times are frequently intentionally slowed to manage surge currents into loads and reduce noise, threshold variations can result in additional uncertainties in the actual on/off timing of the power devices in response to command signals, further complicating the coordination of multiple power switches.

One approach to reverse current protection in power supply ORing applications is to use diodes between the supplies and the load. Schottky diodes can be used in this situation, but their forward voltage drop can cause significant power dissipation and loss. In applications where power must be combined using paralleled sources to power the load, as in some high-power systems requiring multiple supplies for capacity or redundancy, the forward voltage variation and its negative temperature coefficient of Schottky diodes can lead to load sharing issues and even thermal runaway. One higher-performance alternative is an ideal diode integrated circuit, which uses a MOSFET and controller circuitry to emulate an ideal diode having a low forward voltage drop and low reverse current. However, implementing the so-called ideal diode involves considerable circuit complexity in order to detect a small reverse voltage and to ensure that the power switch is off. Even with ideal diode circuitry, it is impossible to completely eliminate forward voltage or reverse current leakage, because of the on resistance and current leakage of the FET. If the ideal diode circuit takes a small reverse voltage of only tens of millivolts to sense a reverse current, while the power device has an on resistance of tens of milliohms, then a voltage difference of only tens of millivolts between the supplies can lead to a transient reverse current flow on the order of amperes. Such an ideal diode IC also consumes quiescent power to operate, which in redundant systems such as radiation-hardened ICs using triple modular redundancy gets multiplied.

There is thus a continuing need for improved power switches that facilitate reliable break-before-make operation with low complexity and power consumption, as well as systems of such power switches and methods for coordinating them.

SUMMARY OF THE INVENTION

Accordingly, power switches are provided that are easily interconnected to enforce coordinated break-before-make operation without requiring complicated additional circuitry to sense reverse currents or to sequence their operation. By including a decision circuit in each power switch that produces an OFF signal indicating when its associated power device is fully off, any number of power switches can be conveniently coordinated using simple logic. Further incorporating enable inputs and optional coordinator circuits in each power switch that accept OFF signals from the other power switches in the system can remove the need for any additional circuitry. For example, in a system that has only two power switches, connecting the OFF signal from each to a single enable input on the other power switch is sufficient to create a break-before-make two-channel power switch exhibiting proper sequencing to enforce safe operation with no risk of reverse currents.

In particular, a power switch having an indicator for an off condition is provided that includes a power device, a gate control circuit, and a decision circuit. A gate control circuit having an input for an on/off command signal generates a drive signal to turn a power device on and off in response to the state of the command signal. A decision circuit is configured to produce an OFF signal that is active, indicating an off condition of the power device, only when the power device is completely off. The decision circuit may accept a sense signal indicating the on/off state of the power device, or a sense signal indicating the on/off state of an emulation device configured to mirror the state of the power device; or the decision circuit may contain a time delay element that is used to cause the OFF signal to become active when an off command is received, or the drive signal initiates turning off of the power device, after an additional delay that is selected to ensure that the power device has turned off fully. The decision circuit may include a latching function that forces the OFF signal inactive as soon as an off command is received, and keeps the OFF signal inactive until a sense signal from the power device or an emulation device indicates that the power device has turned off fully. In some embodiments, the decision circuit may use modular redundancy to reduce the probability of producing a false OFF signal. The power device may be a metal-oxide-semiconductor (MOS) transistor having a gate, a source, and a drain, with the gate driven by the gate control circuit. In some embodiments, the power device may be integrated with the gate control circuit and/or the decision circuit on the same semiconductor substrate, or in the same package as in a multi-chip module. In some embodiments, the gate control circuit also accepts one or more enable signals and requires all enable signals to be active in order to turn on the power device. Some embodiments include fault logic that prevents turning on the power device in the event of a fault. The fault logic may accept one or more fault input signals indicating whether a fault condition has been detected, such as overcurrent at the power device output or an overtemperature condition, or even a fault occurring at another power switch, and generate a fault enable signal used as an input to the gate control circuit.

A coordinated system of power switches is also provided, in which two or more power switches are used to connect at least one power supply to at least one load. Each power switch in the system includes a power device that can be turned on and off between a low-impedance and high-impedance state by a gate control circuit that has a command input and an enable input and produces a drive signal for the power device, and a decision circuit that generates an OFF signal that is only active when the power device is fully in the high-impedance off state. The OFF signal generated by each switch is connected to the enable inputs of all the other switches through logic that produces an active enable signal at a switch only when the OFF signals from all the other switches are active. Embodiments of the system of power switches encompass those that connect multiple power supplies, possibly having different voltages, to the same load, or a single power supply to different loads, as well as multiple power supplies to more than one load. In some embodiments, at least one of the power switches further comprises fault logic that prevents the power device in that switch from turning on when a fault has been detected. In some embodiments, at least one of the power switches can be a bank of switches that are all controlled by the same command and enable signal so that they turn on and off at the same time, connected in parallel between a shared power supply and a shared load for lower on resistance and to carry higher current. A single bank OFF signal may be generated that is active only when all switches in the bank are fully in a high-impedance off state.

A method of coordinating a system of two or more power switches is also provided. Each power switch in the system has a power device, accepts an on/off command signal, and generates an OFF signal that is TRUE only when its power device is fully off. All switches are commanded to turn off, and after waiting for the OFF signals from all switches to become TRUE, a command signal to turn on a switch is watched for. When at least one switch receives a command signal to turn on, one switch c that has been commanded to turn on is picked, and its OFF signal is set to FALSE. The power device in switch c is turned on, and switch c is kept on until it receives a command signal to turn off. When the command signal to turn off is received, the method returns to the step of commanding all switches to turn off. This sequence ensures that only one switch at a time may be on and thus forming a low-impedance connection between a power supply and a load. In some embodiments, the step of waiting for all OFF signals to become TRUE is facilitated by having each switch also accept an enable signal derived from the logical conjunction of the OFF signals generated by all the other switches in the system, such that all the other OFF signals must be TRUE in order to turn the power device on or to keep it on. In some embodiments, a fault condition at one or more switches can be detected, so that after a command to turn on a switch is seen, if a fault at any switch is detected, the method returns to the step of commanding all switches to turn off; and if a fault is detected while switch c is being kept on, the method also returns to the step of commanding all switches to turn off.

Finally, a power switch controller having a gate control circuit and a decision circuit is provided for use with an external power device. The gate control circuit has an input for an on/off command signal and generates a drive signal to turn a power device on and off in response to the state of the command signal. The decision circuit is configured to produce an OFF signal that is active, indicating an off condition of the power device, only when the power device is completely off. In some embodiments, the gate control circuit also accepts one or more enable signals and requires all enable signals to be active in order to turn on the power device. In some embodiments, the decision circuit accepts a sense signal that indicates the on/off state of the power device, and in some embodiments, the decision circuit may include a latching function that forces the OFF signal inactive immediately when a request to turn on the power device is received, and keeps the OFF signal inactive until a sense signal from the power device, or from an emulation device mirroring the power device, indicates that the power device has turned off fully. In some embodiments, the decision circuit may contain a time delay element that is used to cause the OFF signal to become active after an off command is received, or the drive signal initiates turning off of the power device, after an additional delay that is selected to ensure that the power device has turned off fully. In some embodiments, the decision circuit may use modular redundancy to reduce the probability of producing a false OFF signal. Some embodiments of a power switch controller include a coordinator circuit that accepts OFF signals from multiple other power switch controllers and generates an enable signal connected to the gate control circuit, with the coordinator circuit configured to require all of the OFF signals from the other power switch controllers to be active in order generate an active enable signal that permits the power device to be turned on. Some embodiments include fault logic that accepts signals indicating whether a fault condition has been detected and generates a fault enable signal connected to the gate control circuit, allowing the power device to be turned on only when the fault enable signal is active, i.e., in the absence of a fault. Possible fault conditions include overcurrent at the power device output, overtemperature, and reverse current. In some embodiments, the fault logic can latch a fault condition and require a reset by a fault clear signal in order to generate an active fault enable signal.

Power switches, systems, and methods provided herein facilitate reliable break-before-make coordination of power devices connecting multiple supplies to multiple loads, preventing unintentional connection through the power devices of supplies to each other or to the loads, thereby avoiding detrimental or destructive reverse currents, surge currents, or the application of improper voltages to the loads. Having a decision circuit generating an OFF signal at each power switch simplifies power management architectures, enables lower parts counts, and supports redundancy and scaling in high-reliability system applications.

Other features and advantages of the present invention will be apparent to those skilled in the art upon reference to the following detailed description taken in conjunction with the accompanying drawings, which are to be understood to be exemplary and explanatory, and are intended to provide further explanation of the invention as claimed.

DETAILED DESCRIPTION OF THE PREFERRED EMBODIMENTS

The following Detailed Description is merely exemplary in nature and is not intended to limit the various embodiments or the application and uses thereof. Furthermore, there is no intention to be bound by any theory presented in the preceding background or the following detailed description. The techniques and structures described below may be applied in fields and applications beyond those specified here as examples, and the disclosed invention is therefore not to be considered limited to the applications and examples used here for the sake of explaining its principles of operation.

Each logic signal described herein may be designed using positive or negative logic, where a negative logic signal may be conventionally indicated by a bar over the signal name or "_BAR" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals, and therefore in alternate embodiments, those signals described as positive logic signals may be implemented as negative logic signals, and vice versa. As is known by those skilled in the art, combinational logic performed on opposite-polarity logic signals may be implemented equivalently in alternate embodiments using De Morgan's theorem. Since inputs or outputs to the circuits can be implemented in either of these ways, the terms "active" or TRUE will be used interchangeably hereinafter to indicate a logically true signal. In discussing logic timing, the term "immediately" will be understood to accommodate nominal gate delays on the nanosecond time scale.

Figure 1A:
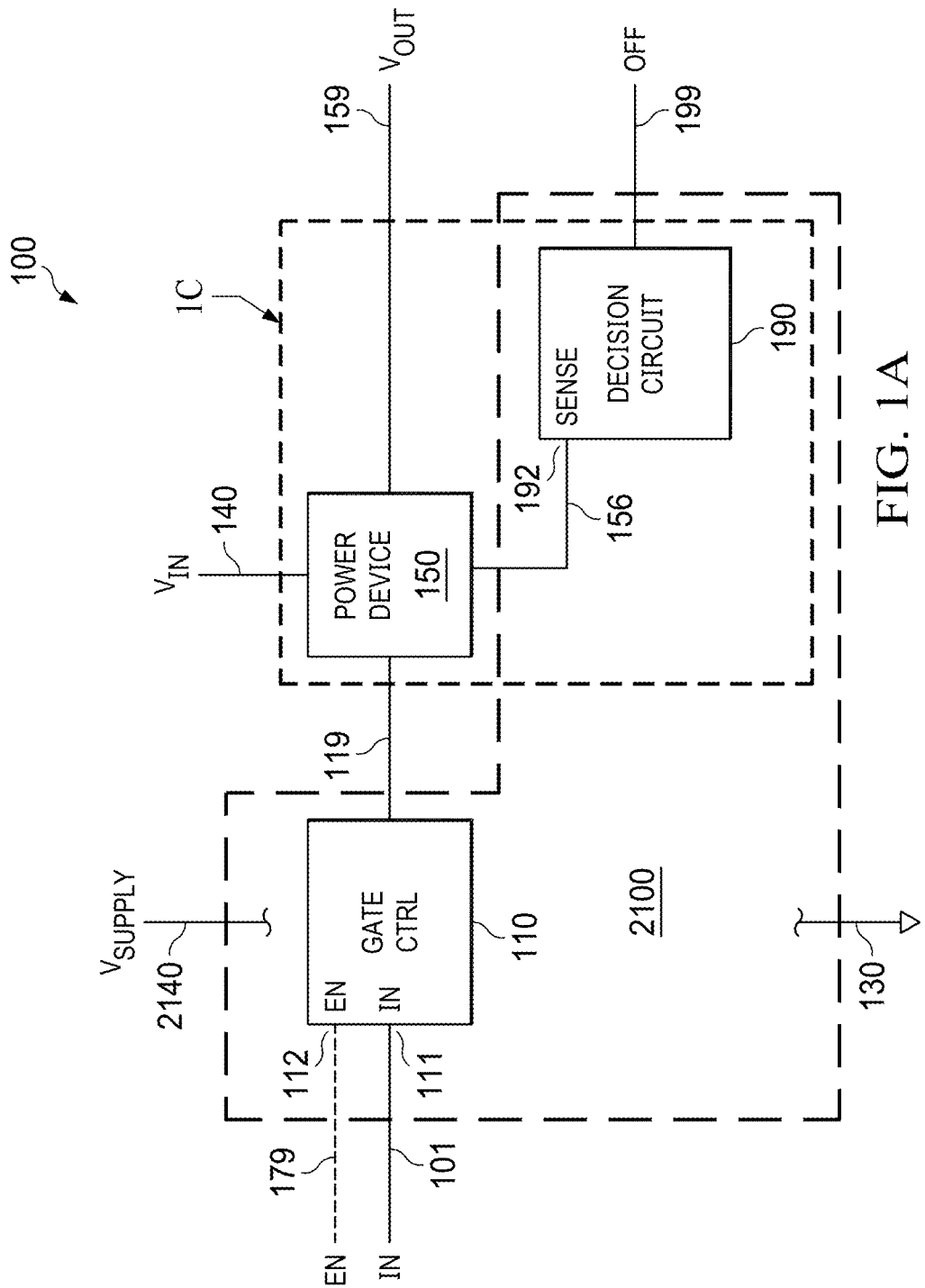
FIG. 1A is a schematic block diagram of a power switch according to the present invention.

Referring now to FIG. 1A, a schematic block diagram of a power switch 100 according to an embodiment of the present invention is shown. Power device 150 is typically a high-side semiconductor switch connected in series between a power supply connected to supply connection 140 at voltage $V_{IN}$ and a load connected to output 159 at voltage $V_{OUT}$. However, some embodiments (not shown) of power switch 100 may instead use a low-side switch connected between the load and ground, whereas other embodiments may drive both high-side and low-side switches, without departing from the scope of the present invention. Power device 150 may be a semiconductor power pass transistor such as a MOSFET and preferably has a low on resistance. Either a P-channel or N-channel MOSFET may be used, depending on the application; P-MOSFETs are shown herein for exemplary illustrations because they have good characteristics such as convenient drive voltages for use in embodiments in which power switch 100 is integrated into a single monolithic CMOS IC. In some embodiments, power device 150 may have a control input and built-in (integrated or co-packaged) drive circuitry allowing it to accept a logic level drive signal 119.

Gate control circuit 110 has a command input 111 that accepts command signal 101 to turn the power device on or off, and generates drive signal 119 that supplies the proper voltages and sufficient drive current to power device 150 to turn it on and off as requested by command signal 101. In some embodiments, gate control circuit 110 also has an optional enable input 112 accepting an enable signal 179, the use and operation of which will be described later. In some embodiments (not shown), gate control circuit 110 may have multiple enable inputs 112 and is configured to require all enable signals 179 at the enable inputs 112 to be active in order to turn on power device 150. In some embodiments, also not shown, a separate command input 111 may be omitted, and the function of command signal 101 may be performed using enable signals 179 applied at enable inputs 112. In some embodiments, command signal 101 (IN) may constitute a more complicated control input than a simple digital logic level, for example, a serial interface bus like I2C, SPI, CAN bus, 1-Wire, etc., or a parallel bus for which gate control circuit 110 implements an interface and interprets on/off commands.

Decision circuit 190 provides an OFF signal 199 that is active only when power device 150 is fully off. The state of being fully off is defined as being at a stable predetermined high impedance sufficient at the operating voltages in a targeted application to substantially block current conduction in both directions between supply connection 140 and output 159; that is, power device 150 is not in the state of being on (low impedance), or in the process of turning on or off (during a transition). To determine whether power device 150 is fully off, in some embodiments, decision circuit 190 has a sense input 192 configured to accept a sense signal 156 from power device 150. Example circuits showing the operation of sense signal 156 are illustrated later in FIGS. 1C and 1D. OFF signal 199 can be a simple logic signal, or a more complicated signal such as a serial interface signal. OFF signal 199 can be connected through appropriate logic to the enable inputs 112 of other power switches, or used by a supervisory controller (not shown) that coordinates a system of power switches to generate command signals 101 for the other power switches. Producing an OFF signal 199 in power switch 100 that indicates when its associated power device 150 is fully off greatly simplifies coordination of a system having more than one power switch 100 and facilitates reliable break-before-make operation of the system of switches. If all power switches 100 have an enable input 112, then simple interconnection of OFF signals 199 on some switches 100 to the enable inputs 112 of other switches can implement break-before-make operation with few or no additional components, as will be seen later with reference to FIGS. 8-10.

Some portions of power switch 100 not including power device 150 can be grouped functionally into a power switch controller 2100, which may be integrated and/or packaged separately from power device 150. In the exemplary embodiment shown in FIG. 1A, power switch controller 2100 includes gate control circuit 110 and decision circuit 190, which are powered through one or more controller supply inputs 2140 and ground connections 130, and have other associated inputs and outputs as previously described. Ground connection 130 may be connected to the ground side of a load (shown in later figures) that is driven by output 159 from power device 150. The controller supply voltage $V_{SUPPLY}$ at controller supply input 2140 may be at a different voltage level from the input voltage $V_{IN}$ at power device supply connection 140. For example, $V_{SUPPLY}$ may be higher than $V_{IN}$ to allow gate control circuit 110 to generate a sufficiently high voltage drive signal 119 for optimally driving an N-MOSFET, if that is the type of power device 150. There may be more than one power supply input 2140 for logic and analog functions, or for interfacing with system circuitry operating at different voltage levels, or to implement power-saving modes; similarly, more than one ground connection 130 may be used to separate high-current noisy paths from, e.g., analog sensing paths. Additional optional inputs and outputs from power switch controller 2100 may be used in some embodiments to implement useful features such as sensing $V_{IN}$ and $V_{OUT}$ for reverse voltage protection, output current sense signals for telemetry/condition monitoring, input and output fault signals (as will be described later), setting overcurrent or overtemperature trip set points, programming soft-start speed, or other intelligence features.

Other groupings of the various functions of power switch 100 may be advantageous in certain system contexts. For example, besides built-in drive circuitry mentioned previously, power device 150 may be integrated or packaged together with decision circuit 190 to facilitate off state sensing, or with temperature or current sensing and possibly fault circuitry to generate an overtemperature and/or overcurrent signal, or with an emulation device, possibly together with decision circuit 190, as will be discussed later with reference to FIGS. 3A-3C. In such cases, the other functions that are integrated into power switch controller 2100 may vary accordingly to produce a complete power switch 100.

Figure 1B:
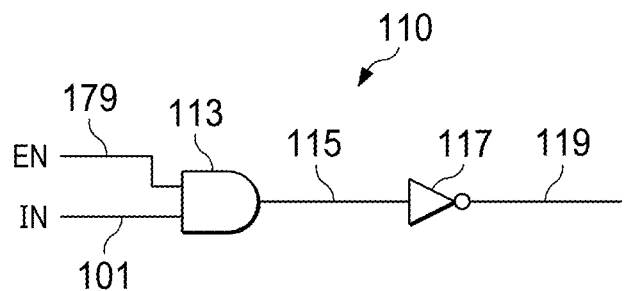
FIG. 1B is a schematic diagram of a gate control circuit used in the power switch of FIG. 1A.

Turning now to FIG. 1B, a simple schematic diagram detailing the basic functions of gate control circuit 110 that accepts an enable signal 179 is shown. Conjunctive logic symbolized by AND gate 113 is used to generate a request logic signal 115 that is active only when IN command signal 101 and enable signal 179 are both active. Driver 117 translates request signal 115 into drive signal 119 having a sufficient drive level to effectively and completely turn on and off power device 150. In FIG. 1B, driver 117 is shown as an inverter, symbolizing an inverting driver that produces a lowered voltage to turn on power device 150, consistent with drive requirements of the high-side P-MOSFET power devices shown elsewhere herein. In some embodiments, driver 117 may be non-inverting to accommodate a different type of power device 150; for example, to operate a high-side N-MOSFET power device, drive signal 119 would be active high and driver 117 may need to be supplied by a charge pump or by a higher voltage $V_{SUPPLY}$ at controller supply 2140. In some embodiments, driver 117 may be packaged externally to power switch controller 2100, so that request signal 115 instead of drive signal 119 may be used as an output of power switch controller 2100.

Figure 1C:
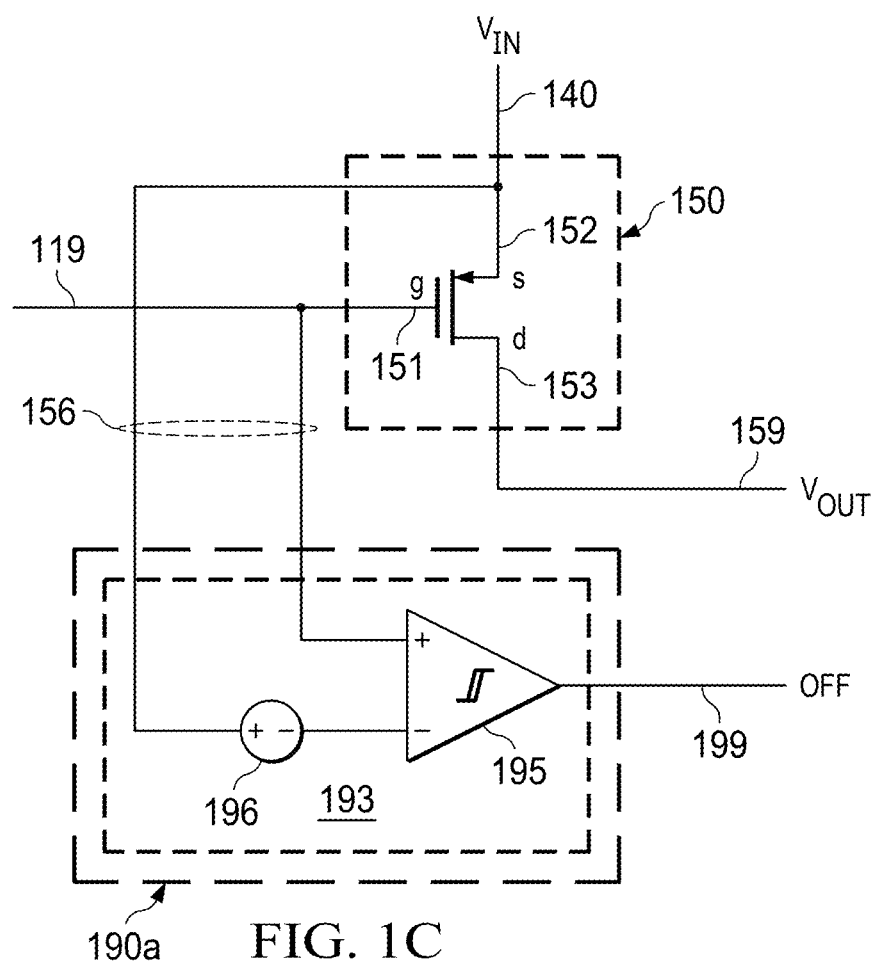
FIG. 1C is a schematic circuit diagram detail of a power device and decision circuit portion of FIG. 1A.

One way of implementing a decision circuit 190 that senses the on/off state of power device 150 is shown in the schematic circuit diagram of FIG. 1C, which is a detail of the portion of FIG. 1A that is indicated by a dashed boundary labeled 1C. This example uses a P-MOSFET power device 150 as a high-side load switch. P-MOSFET 150 has a gate 151 that is controlled by drive signal 119, a source 152 connected to supply connection 140, and a drain 153 connected to output 159 that is used to power an external load (not shown). This first embodiment of a decision circuit 190*a* employs a $V_{gs}$ sensor 193 that accepts a sense signal 156 consisting of two wires connected to gate 151 and source 152 in order to measure the voltage between them. A voltage comparator 195, which, as shown, preferably has hysteresis to prevent spurious transitions at the output, is used to produce OFF signal 199. Offset compensation, represented symbolically by voltage source 196, is performed to adjust a threshold voltage at which $V_{gs}$ triggers OFF signal to go TRUE (active high as shown). As $V_{gs}$ goes progressively more negative, power device 150 turns on; and power device 150 is fully off when the magnitude of $V_{gs}$ is sufficiently below a threshold voltage. The voltage provided by offset compensator 196 is chosen such that OFF signal 199 is only active when power device 150 is ensured to be fully off (i.e., to achieve a predetermined high impedance).

Figure 1D:
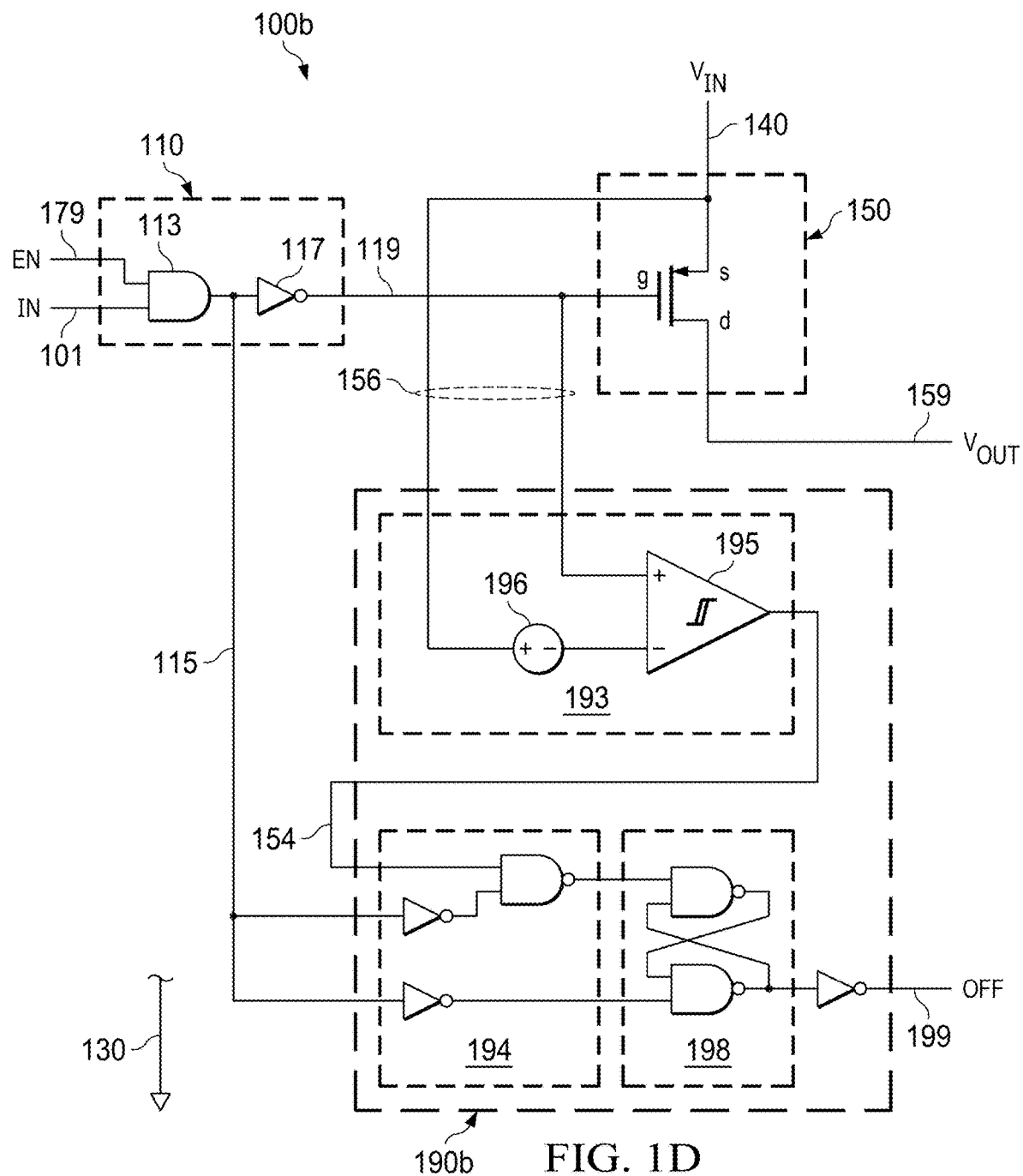
FIG. 1D is a schematic circuit diagram of a power switch having a latching decision circuit.

Another embodiment of a power switch 100b is shown in the schematic circuit diagram of FIG. 1D, which shows a second embodiment 190b of a voltage sensing decision circuit that includes a latching feature that ensures proper sequencing and timing of OFF signal 199 while further guarding against "stuttering" of signal 199. This is accomplished by incorporating a latch 198 that accepts $V_{gs}$ sensor output logic signal 154 (which could have been used directly as OFF signal 199 in the previous embodiment of FIG. 1C) as well as request signal 115, both of which are processed by conditioning logic 194 to apply the proper polarity signals to the inputs of latch 198. With the positive logic signals shown and latch 198 being a NAND-type SR latch as shown, an inverter is required to generate an OFF signal 199 having the proper polarity (i.e., active high=TRUE, meaning power device 150 is fully off). An asynchronous transparent latch 198 as shown is preferred to optimize timing of the response of OFF signal 199 to the states of signals 115 and 154. As will be understood by those skilled in the art, other types of latch such as a NOR gate SR latch, or one or more active low signals may be used with appropriately adapted conditioning circuitry 194.

Figure 2:
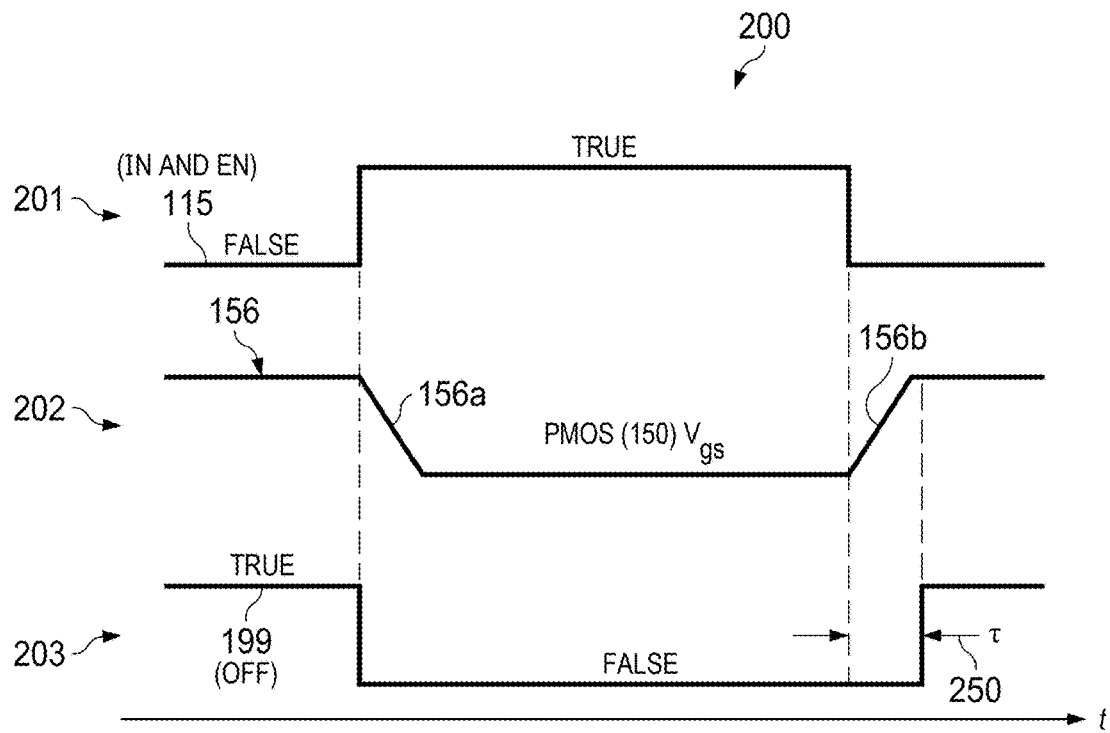
FIG. 2 is a timing diagram for signals in a power switch.

A timing diagram 200 showing desirable behavior of key signals in a power switch 100 using a voltage sensing decision circuit 190a or 190b is presented in FIG. 2. Plot 201 shows request signal 115 (IN AND EN) making a transition from FALSE to TRUE, i.e., requesting that the power device 150 turn on, and then returning to FALSE requesting power device 150 to turn back off. Plot 202 shows sense signal 156, which represents $V_{gs}$ of PMOS power device 150. Turn-on and turn-off transitions of the gate-source voltage, 156a and 156b respectively, are analog and while they may be intrinsically significantly slower than transitions on logic signals 115 and 199, the rise and fall times (slew rates) of these transitions may be intentionally further slowed by "slow-start" drive circuitry in driver 117 in order to reduce surge currents and noise when power device 150 is turned on and off. Sense signal 156 starts ramping down to a low $V_{gs}$ to turn PMOS 150 off as soon as request signal 115 goes TRUE, and starts ramping back up as soon as request signal 115 returns to FALSE. The desired behavior of OFF signal 199 in response to these request 115 and sense 156 signals is shown in plot 203 of the timing diagram 200. Latching decision circuit 190b in FIG. 1D produces this characteristic by turning OFF signal 199 to FALSE immediately when request signal 115 to turn power device 150 on goes TRUE; and OFF signal 199 does not return to TRUE until $V_{gs}$ returns to a voltage level that guarantees that power device 150 has been driven fully off. The rise time of OFF transition 156b on sense signal 156 can be seen to result in a time delay 250 (τ) between request signal 115 requesting that power device 150 turn off and OFF signal 199 turning TRUE.

Figure 3A:
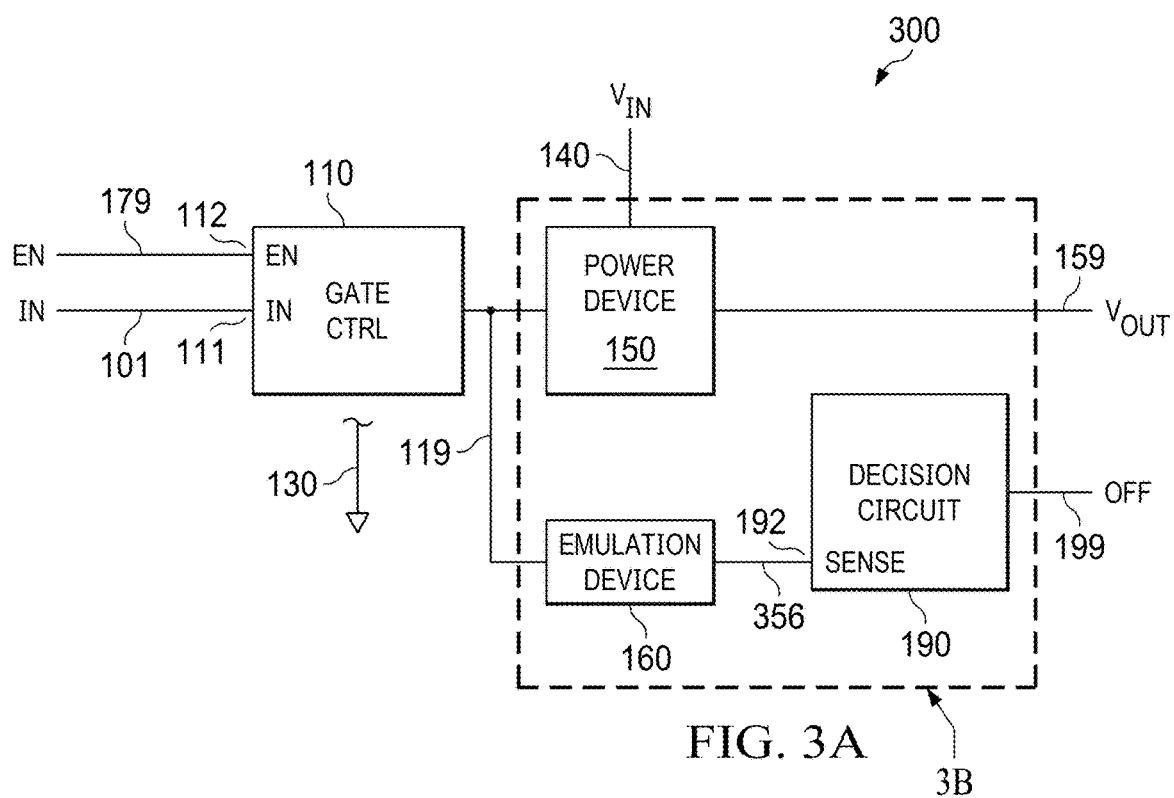
FIG. 3A is a schematic block diagram of a power switch having an emulation device.

FIG. 3A shows a block diagram of another alternate embodiment of power switch 300 in which decision circuit 190 does not sense the status of power device 150 directly, but rather the status of an emulation device 160 that need not carry as large a current. Emulation device 160 is configured so that its state mirrors that of power device 150; it may be a physically smaller device configured to have a similar threshold voltage to power device 150, and may be (but need not be) the same type of device as power device 150. Decision circuit 190 accepts emulation sense signal 356 at sense input 192 instead of a sense signal from power device 150. In some embodiments, the emulation device may produce an inverted sense signal 356 while otherwise mirroring the characteristics of power device 150. In embodiments in which power device 150 is not integrated or co-packaged with power switch controller 2100 (not shown in FIG. 3A), emulation device 160 is preferably integrated into the same package as power device 150 so that its temperature tracks that of the power device, hence facilitating a more accurate estimation of when power device 150 is fully off than if it were thermally separated. In such an embodiment, power switch controller 2100, if it were drawn in FIG. 3A, would include gate control circuit 110 and decision circuit 190.

Figure 3C:
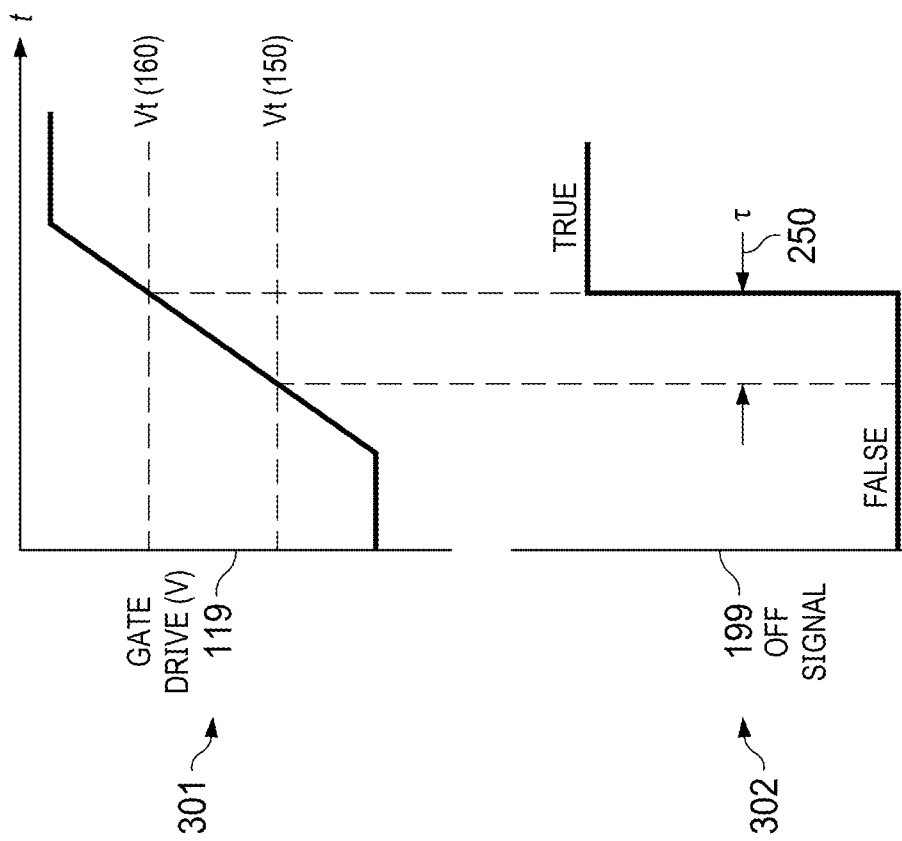
FIG. 3C is a timing diagram for signals in the circuit of FIG. 3B.
Figure 3B:
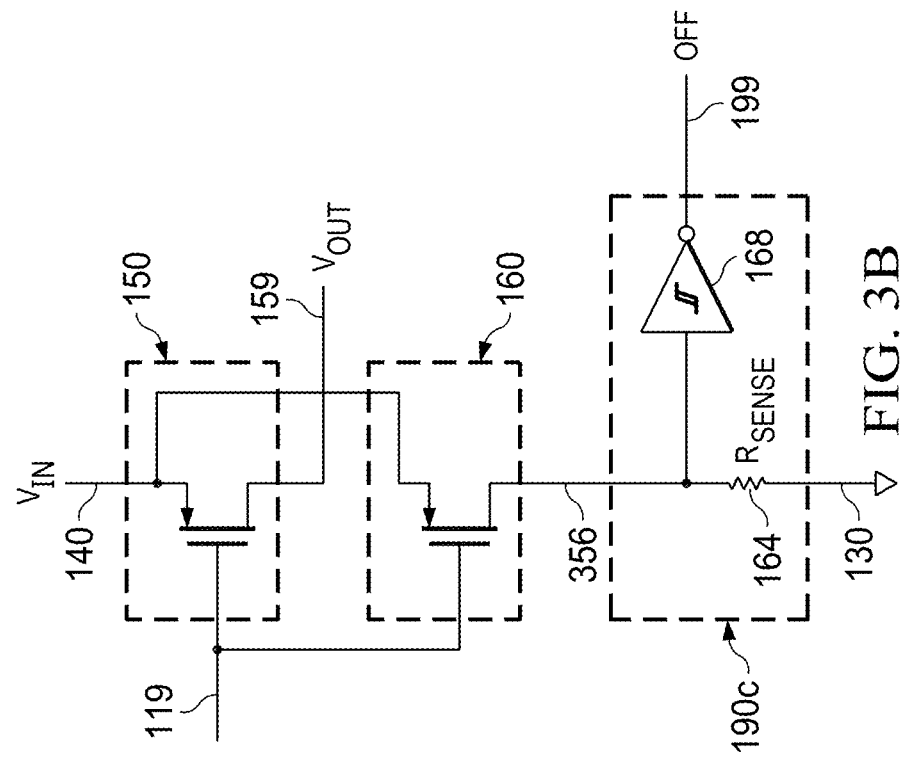
FIG. 3B is a schematic circuit diagram detailing a portion of FIG. 3A.

FIG. 3B is a schematic circuit diagram of the portion of the block diagram of power switch 300 in FIG. 3A that is surrounded by the dashed line labeled 3B, illustrating a possible decision circuit 190c for generating OFF signal 199 that senses current through emulation device 160. Emulation device 160 is a P-MOSFET, the same type as power device 150, and the gate of emulation device 160 is driven by the same drive signal 119 that drives the gate of power device 150, so emulation device 160 will be turned on and off at the same time as power device 150. Current through the drain of emulation device 160 constitutes emulation sense signal 356, and a third embodiment of decision circuit 190c is configured to produce an active OFF signal 199 when this emulation device drain current is low, indicating that emulation device 160 is off. This can be done using the example decision circuit 190c comprising a Schmitt inverter 168 (which functions as an inverting comparator with hysteresis) sensing the voltage on sense resistor 164, which converts a current in sense signal 356 to a voltage at the inverter input. The threshold at which emulation device drain current is low enough to trigger an active OFF signal 199 may be adjusted by changing the value of sense resistor 164 as well as by altering gate length and width in emulation MOSFET 160. In FIG. 3C, a voltage characteristic 301 and resulting time response 302 are shown, assuming a ramp in gate voltage drive signal 119. The design of emulation device 160 is chosen so that it has a (negative) threshold voltage Vt(160) that is smaller in magnitude (at a higher absolute voltage) than threshold voltage of power device 150 [$V_{gs}$(th)=Vt (150)]. Thus for these P-MOSFET devices, as gate drive voltage increases to turn the devices off, power device 150 turns off before emulation device 160 turns off, ensuring that an OFF signal 199 generated by measuring emulation device current is conservative, so that if emulation device 160 is measured to be off, power device 150 is guaranteed to be fully off. In the case of a slow turn-off (156b as in FIG. 2), voltage plot 301 exhibits a ramp with time as shown in FIG. 3C, leading to a beneficial time delay 250 (t) between the power device 150 crossing threshold to off in voltage plot 301, and OFF signal 199 going TRUE in plot 302 in response to sensing the current through emulation device 160, which goes low when drive signal 119 voltage crosses emulation device threshold Vt(160).

Figure 4:
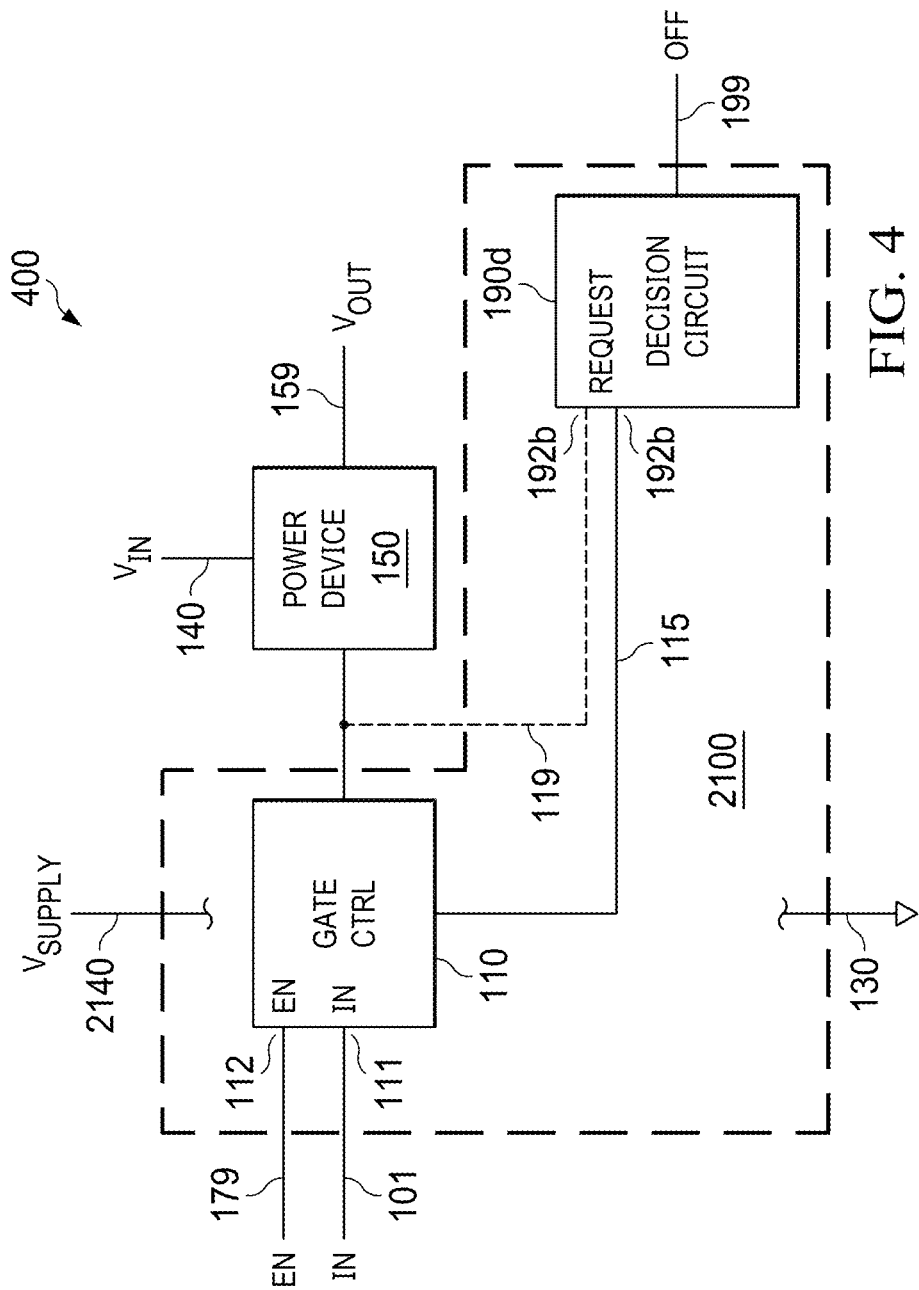
FIG. 4 is a schematic block diagram of another power switch.

Yet another way to implement production of an OFF signal 199 is shown in the block diagram of FIG. 4, illustrating a power switch 400 having an alternative decision circuit 190d. Instead of an analog sense input 192 accepting a sense signal 156 or 356 based respectively on sensing the on/off status of power device 150 or an emulation device 160, decision circuit 190d has a request input 192b accepting a logic signal input derived from a command signal to turn power device on and off. This input signal can be request signal 115, which is active when command signal 101 and enable signal 179 are both active; or optionally (as shown by a dashed line into an alternate request input 192*b*) derived from drive signal 119, which more closely follows the gate signal applied to power device 150. Decision circuit 190*d* contains a time delay element (not shown) that is triggered by a command to turn off the power device, and after a time delay that has been selected to ensure that the power device has had time to turn off fully, changes the OFF signal 199 to active, signaling that power device 150 is now fully off and another power switch 400 (or any alternative embodiment) may turn on if it receives a command signal 101 instructing it to do so. This embodiment thus provides another way to produce a reliable OFF signal 199 that ensures that power device 150 is fully off.

Figure 5:
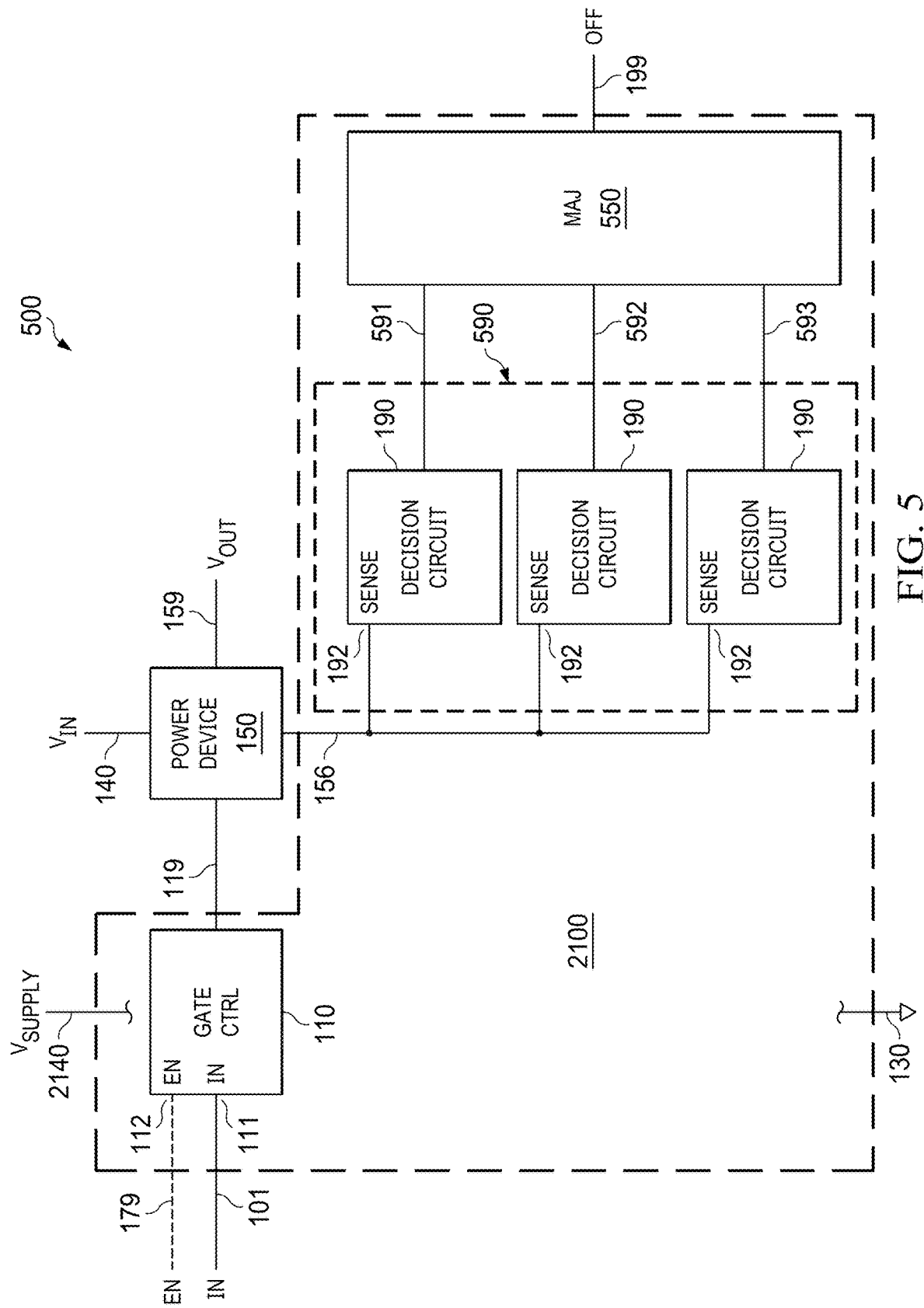
FIG. 5 is a schematic block diagram of a power switch using a triple modular redundant decision circuit.

For some applications in which false indications of the power device OFF status can be particularly destructive, it may be useful to mitigate or correct errors that can arise in the decision circuit 190 or in surrounding circuits such as sense signal generation, or from transients in power device 150. In high-radiation environments such as the natural space environment experienced by satellites and other space vehicles, as well as those encountered in some terrestrial medical, industrial, nuclear power, particle physics research, and military applications, nondestructive single-event effects (SEE) due to single-event transients (SET) caused by individual energetic ions traversing an electronic device can result in either transient or persistent errors in the functioning of integrated circuits. High-reliability systems often use modular redundancy techniques for recovery from failures and for error correction, and these principles can be applied to embodiments of high-reliability power switches and systems. Referring now to FIG. 5, a block diagram is shown of a power switch 500 employing triple modular redundancy (TMR) in the decision circuitry in order to greatly reduce the probability of generating an erroneous OFF signal 199. A triple-redundant (TMR) decision circuit 590 includes three nominally-identical replicated redundant decision circuits 190, which for the sake of the illustrated example, are of the type using a sense signal 156 from power device 150 at sense inputs 192. In other embodiments, modular redundancy principles may also be used in replicating decision circuits 190 that are based on time delays as in FIG. 4. Each redundant decision circuit 190 generates an OFF signal, so that TMR decision circuit 590 produces three individual OFF signals 591, 592, and 593. Single-event transients that temporarily generate an erroneous signal or state can occur in circuitry anywhere within decision circuits 190, from sense inputs 192 to the outputs; but the circuits can be laid out in an integrated power switch controller 2100 in such a way as to make simultaneous errors on outputs 591, 592, and 593 of extremely low probability. Individual OFF signals 591, 592, and 593 are applied to the inputs of a majority voter 550 configured to produce an OFF signal 199 at its output that requires at least two of decision circuits 190 in TMR decision circuit 590 to agree. In other words, two correct OFF signals will collaborate to dominate and produce a correct OFF signal 199 in spite of a single erroneous individual OFF signal. Higher-level redundancy employing more redundant decision circuits and a majority voter with a correspondingly greater number N of inputs (N-modular redundancy) is also possible, although the amount of circuitry required, and thus the circuit real estate required and associated power dissipation increase rapidly with N, so that triple redundancy is usually preferable. In some embodiments, TMR techniques may also be applied to other circuitry in power switch controller 2100 as well, such as gate control circuit 110, to enhance overall system reliability.

Figure 6:
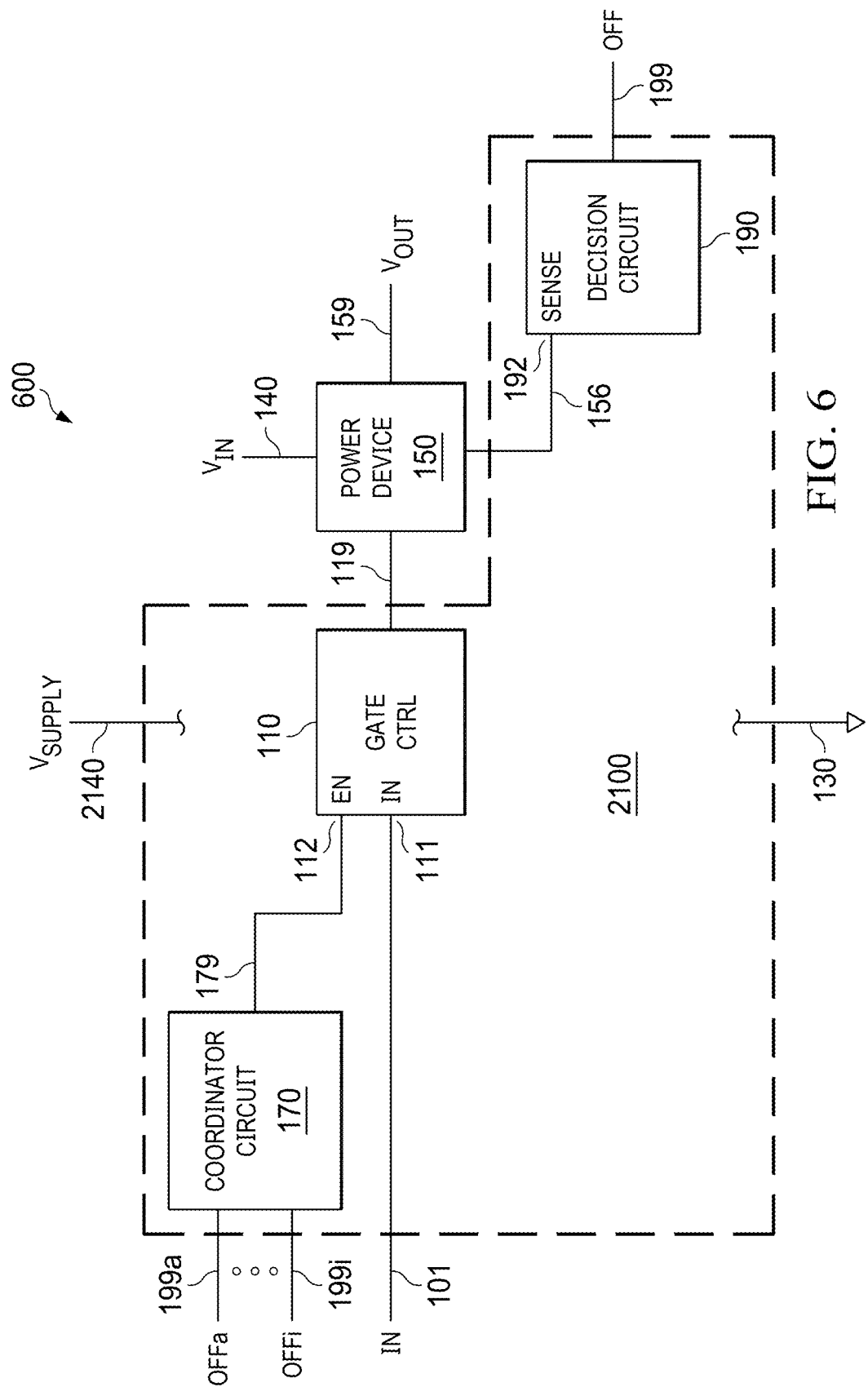
FIG. 6 is a schematic block diagram of a power switch having a coordinator circuit.

FIG. 6 shows a power switch 600 having an additional coordinator circuit 170 to generate a consolidated enable signal 179 to apply to gate control enable input 112, for use in a system having more than two power switches 600. In a system having just two power switches of any of the types previously illustrated (e.g., 100, 100*b*, 300, 400, 500), a single EN input 112 in each power switch can be connected to the OFF signal 199 of the other power switch to complete a system with reliable break-before-make operation. In systems having more than two power switches, external conjunctive logic (e.g., AND gates when used in positive logic with active-high OFF signals) can be used to generate enable signals 179 for each power switch based on the OFF signals 199 from the other switches. But such conjunctive logic can be integrated into coordinator circuit 170 in each power switch controller portion 2100, in order to reduce system parts count and size, and potentially improve board-level reliability. In the exemplary embodiment shown of power switch 600, OFF signals 199*a* through 199*i* (OFFa through OFFi), from other power switches that are used in a coordinated system together with the illustrated instance of power switch 600, are inputs to coordinator circuit 170 that generates internal enable signal 179, while the instance of power switch shown generates its own OFF signal 199 to be sent to the other switches in the system.

Figure 7:
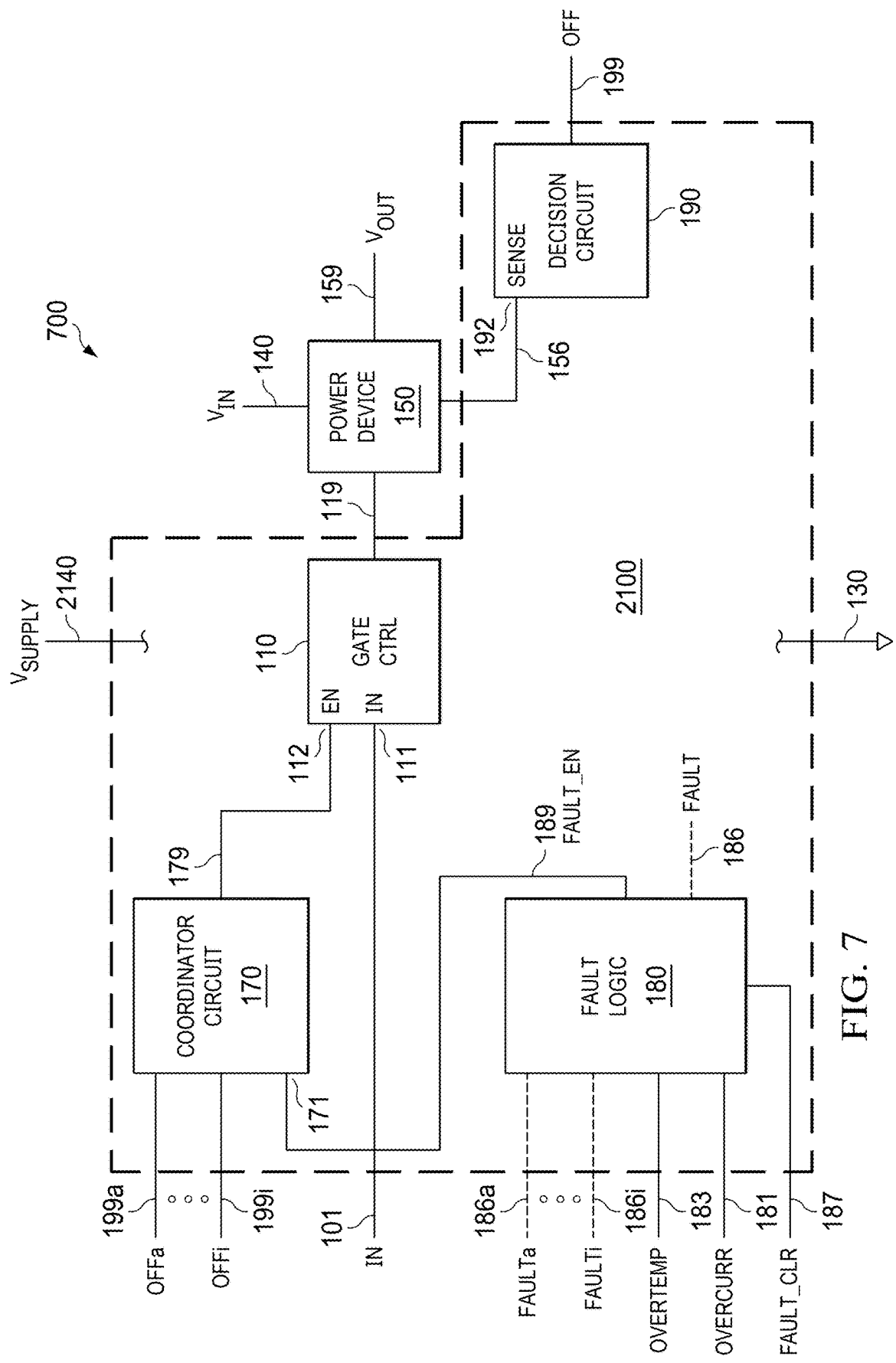
FIG. 7 is a schematic block diagram of a power switch having fault logic.

Additional useful features for improving operation and system reliability can also be incorporated into embodiments of power switches according to the present invention. Power switch 700, shown in FIG. 7, includes additional fault logic 180 that can be used to detect and act upon fault conditions local to power switch 700, and optionally to output an external fault notification signal 186 or to account for fault notification signals 186*a* through 186*i* originating from other power switches 700 in a system. Fault logic 180 generates a fault enable signal 189 (FAULT_EN) which in the embodiment shown may be active high and connected to fault enable input 171 on coordinator circuit 170. In this way an active enable signal 179 will be generated by conjunctive coordinator circuit 170 only if no fault condition is detected by fault logic 180 and all other OFF signals 199*a* through 199*i* are active. Local fault conditions include possible overcurrent conditions at the power device output 159, which can endanger power device 150 and load circuitry connected to it, indicated by an active overcurrent signal 181 (OVERCURR); and possible overheating of power device 150, indicated by active overtemperature signal 183 (OVERTEMP). Circuitry to sense these local fault conditions and generate the various fault input signals is not shown, but may be integrated with the other components of power switch 700 in monolithic embodiments. These local fault signals are most conveniently generated in an integrated embodiment, but in embodiments in which power device 150 is packaged separately from other components of power switch 700 such as power switch controller 2100, overcurrent signal 181 or overtemperature signal 183 may be generated at or near power device 150 and thence delivered to inputs of power switch controller 2100. In some embodiments, a fault that is detected may be latched by fault logic 180, and an additional fault clear signal 187 (FAULT_CLR) may be required to reset the fault logic to generate an active fault enable signal 189 and thereby permit resumption of normal operation.

Figure 8:
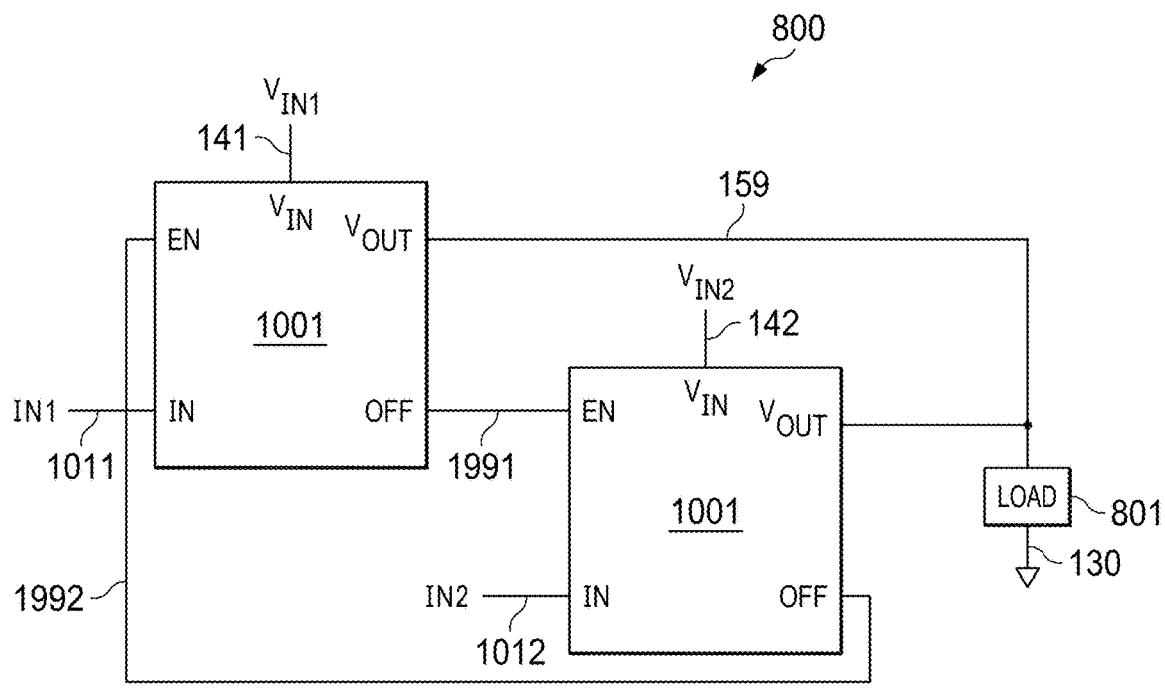
FIG. 8 is a schematic block diagram of a system of power switches connecting two power supplies to one load.
Figure 9:
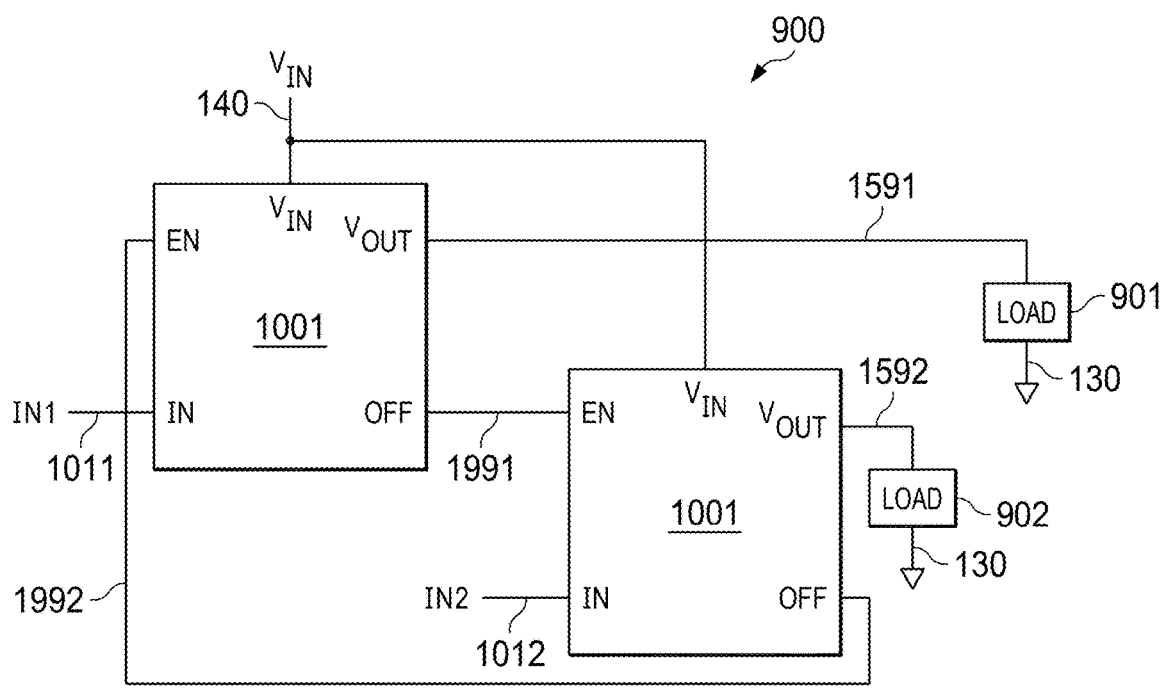
FIG. 9 is a schematic block diagram of a system of power switches connecting one power supply to two loads.
Figure 10:
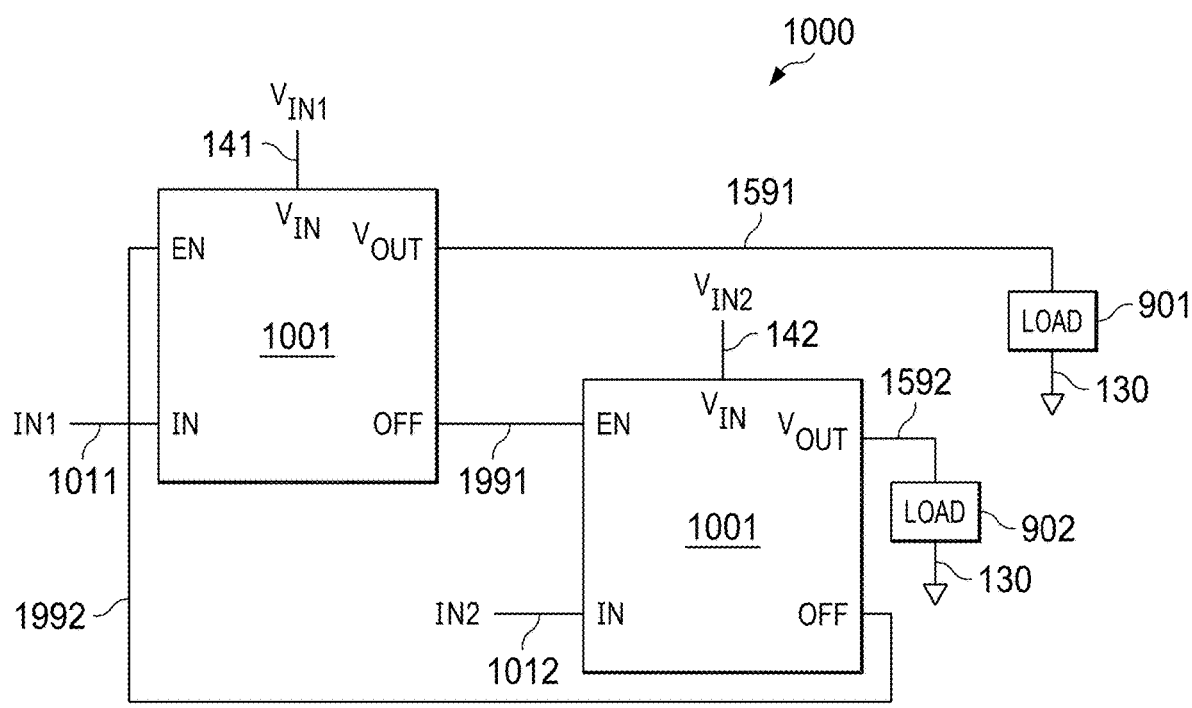
FIG. 10 is a schematic block diagram of a system of power switches connecting two power supplies to two loads.

FIGS. 8-10 are schematic block diagrams of coordinated power switch systems 800, 900, and 1000 that are each constructed using two power switches 1001. Each power switch 1001 shown represents any of the various embodiments heretofore described, of types 100, 100*b*, 300, 400, 500, 600, or 700, in any combination; or power switch 1001 may represent other embodiments having enable inputs and OFF signal outputs. The two power switches 1001 need not be of exactly the same type. Power supply inputs 2140 and ground connections 130 for power switches 1001 are omitted from the figures for clarity. Although these examples show only two power switches 1001, it will be apparent to those skilled in the art that systems having larger numbers of power switches 1001 can be constructed using conjunctive logic of OFF signals performed using either an internal coordinator circuit 170 as in FIGS. 6 and 7, or external circuits (not shown).

The power switch system 800 in FIG. 8 is used to connect two power supplies 141 (at supply voltage $V_{IN1}$) and 142 (at supply voltage $V_{IN2}$) with a common output 159 to a single load 801. The OFF signal from each power switch 1001 is connected to the enable input of the other using cross-connections 1991 and 1992, with no additional components required. Regardless of the states of their respective command inputs 1011 (IN1) and 1012 (IN2), only one at a time of $V_{IN1}$ and $V_{IN2}$ can be connected to load 801, and break-before-make operation is assured by the operation of a decision circuit 190 within each of power switches 1001, as described earlier in more detail. A topology like that of system 800 is useful in power supply ORing for various applications. For example, if both supplies 141 and 142 have the same voltage $V_{IN1}=V_{IN2}$, one supply can be used as a backup spare for the other; while the spared supply is powered down (cold-spared) to save total power consumption, then its output voltage may be at ground instead of floating, and it will be apparent that providing a reliable break-before-make switchover according to the principles described above is important to avoid reverse currents and surges. In some systems, it may be desirable to power load 801 with different voltages $V_{IN1}$ and $V_{IN2}$ at different times to perform different functions and to save power in a low-voltage mode during times in which a function can be performed by load 801 that only requires the lower voltage.

In FIG. 9, a power switch system 900 is shown that connects one supply 140 at voltage $V_{IN}$ through two power switches 1001 to one or the other of two different loads 901 and 902. Load 901 will be powered through output 1591 if command signal 1011 (IN1) at the first power switch 1001 is calling for power and also receiving an active second OFF signal 1992 at its enable input. Since only one load can be powered at a time, load 902 can only be connected to power through output 1592 of the second power switch 1001 if enable signal 1991 receives an active first OFF signal from the first power switch indicating that the first power switch has turned completely off. Since only one of loads 901 and 902 can be powered at a time, this type of system may be useful for cold-sparing a load circuit, e.g., powering off load 902, to be used as a backup for a (typically identical) load 901. Again, break-before-make operation prevents detrimental reverse currents from flowing during switchover.

FIG. 10 is a schematic block diagram illustrating a power switch system 1000 in which two separate power supply connections 141 and 142 may be connected by two power switches 1001 through their respective outputs 1591 and 1592 to two separate loads 901 and 902. This exemplary power switch system may be useful in ensuring that only one power supply is connected to its corresponding load at a time, for example to minimize power consumption, and to prevent overall system power transients that might occur if both loads were powered briefly during a switchover of command signals 1011 and 1012.

Figure 11:
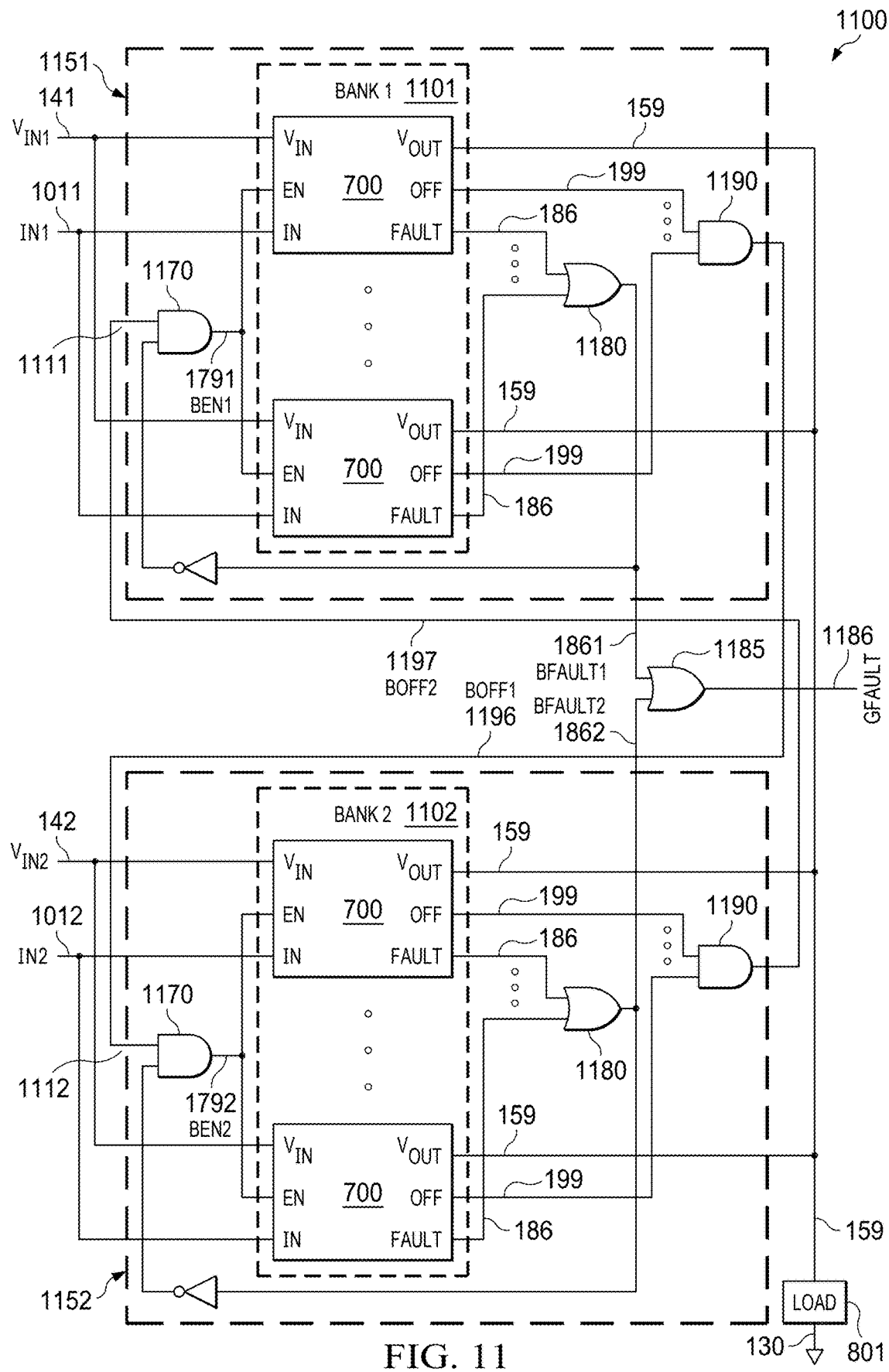
FIG. 11 is a schematic block diagram of a system of power switches having two banks of switches connecting two power supplies to one load.

In some systems, multiple power devices must be connected in parallel in order to manage power dissipation in each power device while providing a high operating current to a load. In FIG. 11, a schematic block diagram is presented of an exemplary power switch system 1100 connecting two power supplies to a single load in which, instead of individual power devices, more-sophisticated power switches 700 of a type featuring fault detection and reporting through fault notification signals 186 are arranged into two banks 1101 (BANK 1) and 1102 (BANK 2) each having two or more paralleled power switches 700. The two banks are configured to operate as two high-capacity power switches 1151 and 1152 in which all switches 700 in each bank are turned on or off in unison. In analogy with power switch system 800 in FIG. 8, first bank 1101 and second bank 1102, controlled by command signals 1011 and 1012, respectively, connect first supply input 141 at voltage $V_{IN1}$ and second supply input 142 at voltage $V_{IN2}$ to a common output 159 feeding load 801.

Enable logic and fault logic in system 1100 are complicated slightly by a bank topology, but may be organized advantageously as follows. OFF signals 199 from all power switches 700 in each bank are connected through conjunctive logic (an AND gate) 1190 that produces a bank OFF signal for each bank. The AND gate 1190 for bank 1101 (BANK 1) produces signal 1196 (BOFF1) that is connected to bank enable input 1112 for bank 1102 (BANK 2). Similarly, The AND gate 1190 for bank 1102 (BANK 2) produces signal 1197 (BOFF2) that is connected to bank enable input 1111 for bank 1101 (BANK 1). These connections provide the cross-connection between OFF signals and enable inputs required to ensure break-before-make operation of the two banks of power switches. Fault logic is incorporated by using disjunctive logic 1180 (OR gates) to combine fault notification signals 186 from all of the power switches in each bank to produce bank fault signals 1861 (BFAULT1) and 1862 (BFAULT2). These bank fault signals are inverted to feed back into AND gates 1170 used to generate bank enable signals 1791 (BEN1) and 1792 (BEN2). By doing so, if a fault is detected in any power switch 700, its fault notification signal 186 will be used to disable all power switches in its own bank, but will not disable power switches in the other bank. In other words, while the OFF signals are ANDed and cross-connected to enable the other bank, the fault signals are ORed and connected back to the same bank to disable itself in case of a fault. Bank fault signals 1861 (BFAULT1) and 1862 (BFAULT2) may be optionally combined by OR gate 1185 to generate a global fault signal 1186 (GFAULT) that is useful to indicate that a fault has occurred anywhere in power switch system 1100. Global fault signal 1186 (GFAULT) might be used by a supervisory controller or annunciator (not shown) to take further system-wide action, or to simply indicate or display an occurrence of such a fault.

Figure 12:
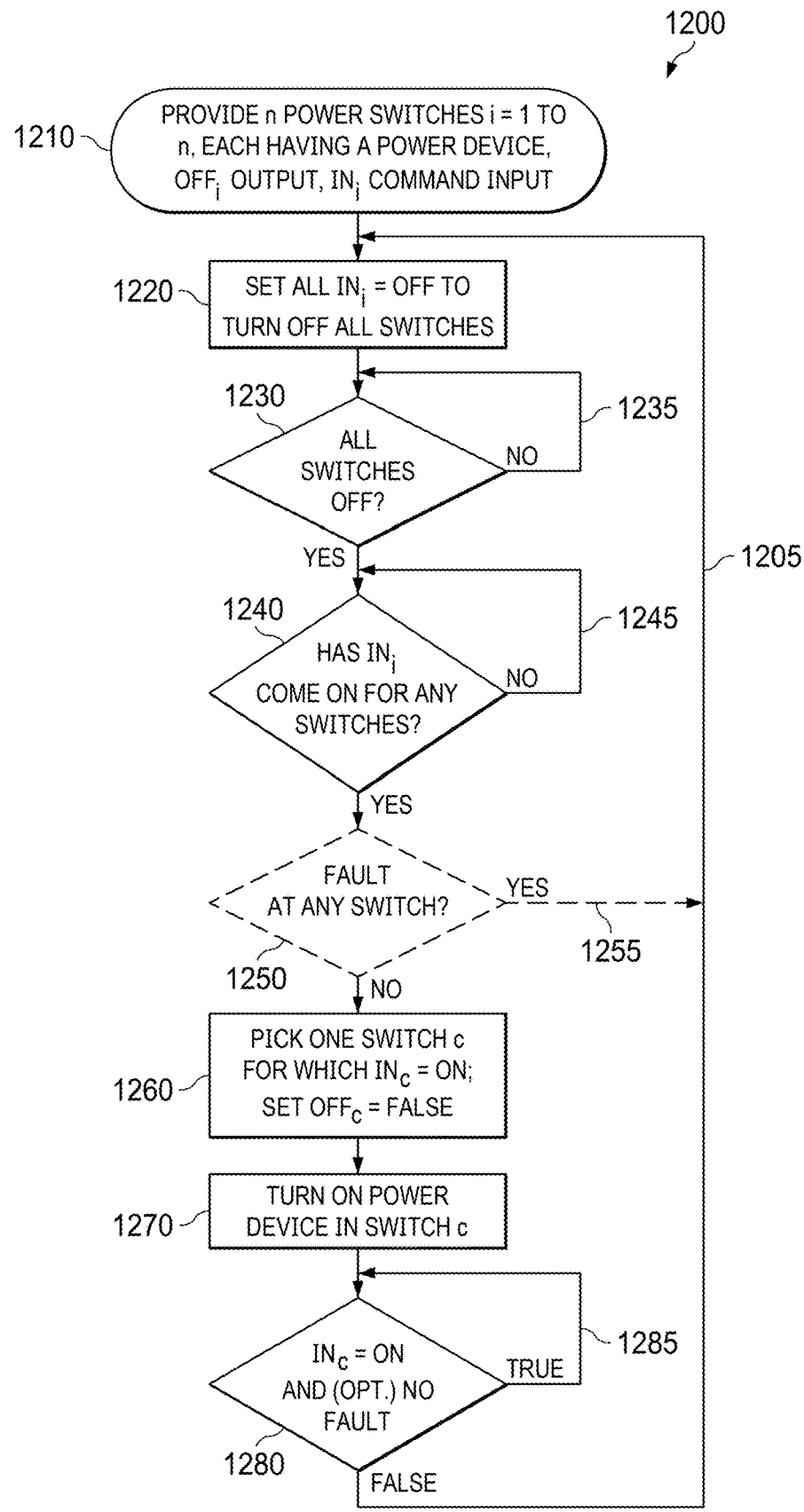
FIG. 12 is a flow chart of a method of coordinating a system of power switches.

FIG. 12 is a flow chart for a method 1200 of coordinating a system of power switches. Step 1210 starts by providing a number n of power switches which may be enumerated i=1 through n. Power switch i has a power device that forms a controllable connection between a power supply and a load, and has a command input that accepts a command signal $IN_i$ to turn the power device on and off. Each power switch i also generates an OFF signal at its OFFi output that is TRUE (i.e., active) only when the power device is fully off, as defined above in relation to the operation of decision circuit 190. In step 1220, all switches in the system are commanded to turn off by setting all $IN_i$ to off. Step 1230 implements waiting for all switches i to turn fully off; this may be accomplished, for example, by checking whether all OFFi signals are TRUE, and if not, returning to wait block 1230 via return path 1235. In systems having enable inputs in the switches, these enable inputs at each switch may be used with conjunctive logic (ANDs for active-high OFF signals) to determine that all the other switches are off. After all switches are confirmed to be fully off, step 1240 watches for at least one command IN=ON to turn on at least one switch, and if no command has occurred, returns to 1240 via path 1245 until a command occurs. Step 1250 is an optional step that may be used for systems having the capability of detecting a fault at one or more switches. In such a system, if a command to turn on a switch occurs, a fault is checked for, and if there is a fault, paths 1255 and 1205 are taken to return to step 1220 to turn off all switches. If there is no fault, or in systems lacking fault detection capability, the method proceeds to step 1260, in which one switch (identified herein as switch c) is picked (i.e., selected) among the one or more switches commanded to turn on, and its OFF signal ($OFF_c$) is immediately set to FALSE. Systems in which switches accept an enable signal may be configured with conjunctive logic such that this FALSE (inactive) OFF signal ($OFF_c$) prevents all the other switches from turning on. Once $OFF_c$ is FALSE, the power device switch c may be physically turned on (which may not be instantaneous, particularly in a switch with soft-start capability) in step 1270 in response to the command $IN_c$=ON. After switch c is on, step 1280 keeps this switch on while its command input $IN_c$ remains active. If switch c has an optional enable input, the signal at this input $EN_c$ must also remain TRUE, indicating that all the other switches are still off, for it to remain on. Similarly, if the system has optional fault detection capability, switch c will be kept on if there is also no fault, in addition to the requirements that $IN_c$ (and optionally also $EN_c$) remain active. The function of keeping switch c on is performed by loopback path 1285 that returns the method to step 1280. As soon as command signal $IN_c$ stops requesting for switch c to be on, or there is a fault, or an enable signal for switch c stops being active, the FALSE branch out of step 1280 returns the method via return path 1205 to step 1220 of turning off all switches. This method ensures that only one switch at a time forms a low-impedance connection between a power supply and a load, and is applicable to systems having more than one power supply and/or more than one load.

Figure 13A:
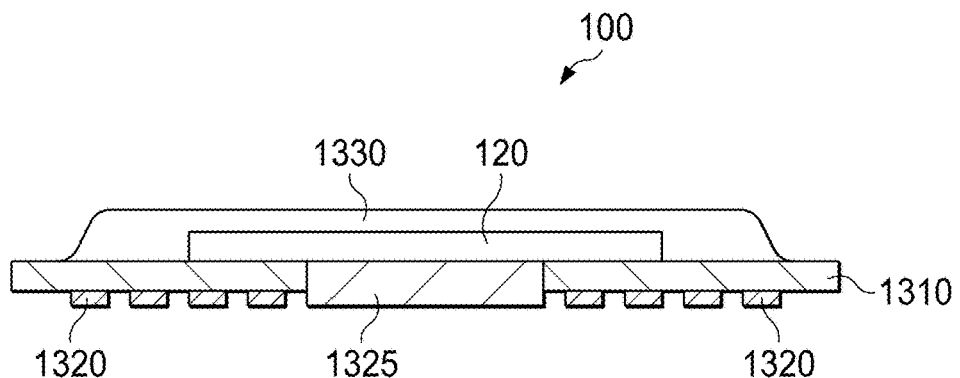
FIG. 13A is a cross-section elevation of a packaged power switch IC.
Figure 13B:
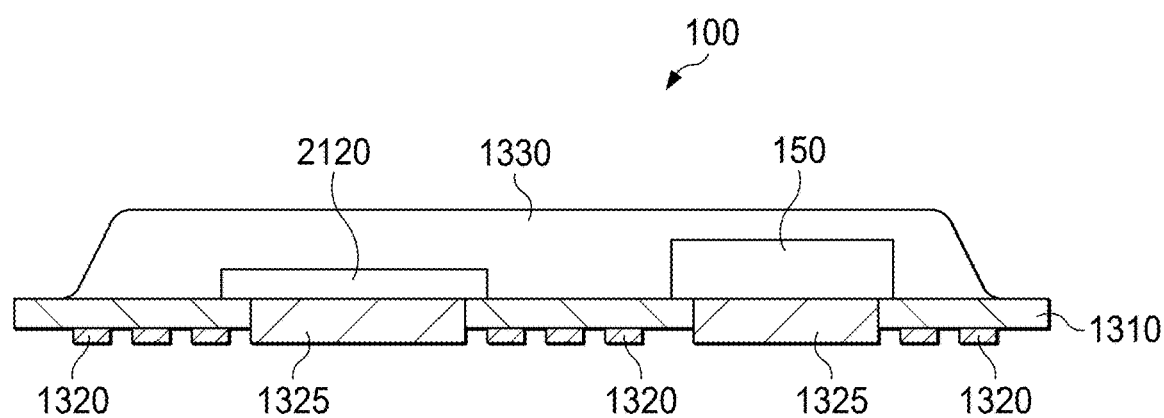
FIG. 13B is a cross-section elevation of a multi-switch module embodiment of a packaged power switch.
Figure 13C:
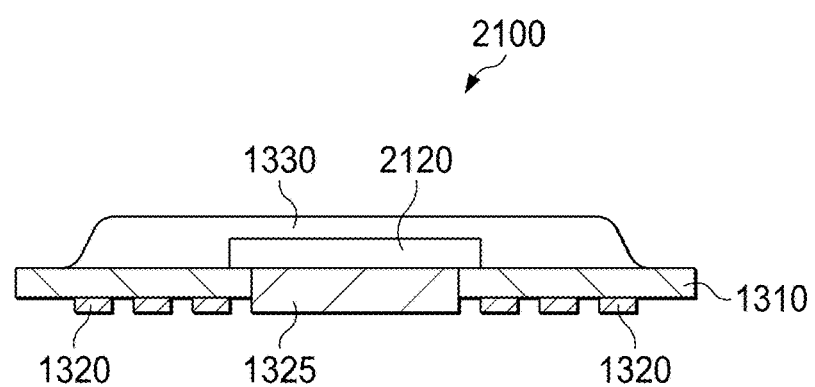
FIG. 13C is a cross-section elevation of a packaged power switch controller IC.

FIGS. 13A-13C show cross-sectional elevation views of various embodiments of the present invention housed in representative protective integrated circuit packages. Referring now to FIG. 13A, a monolithic power switch 100 is shown in which the components of power switch 100 including power switch controller 2100 and power device 150 are integrated together onto a single semiconductor substrate, shown as integrated circuit die 120. IC die 120 is mounted (attached) to package substrate 1310, which could be polymer, metal, or ceramic, and may include redistribution layers to make connections between signal pads on die 120 and terminals 1320, or in some embodiments, substrate 1310 could be a conductive lead frame. Optional conductive pad 1325 in some embodiments enhances thermal contact between die 120, which includes power device 150, and higher-level packaging such as printed wiring boards for effective heat dissipation. Conductive pad 1325 may also be electrically conductive, and serve as a ground contact that can handle large currents in some embodiments. Terminals 1320 are shown as pads or lands in FIG. 13A, but are exemplary of terminals in a variety of integrated circuit packages, which may be pads, leads, lands, or pins, as known in the art. Terminals 1320 and conductive pad 1325 may be flush with the bottom of package substrate 1310 in some embodiments, instead of protruding as illustrated in the figures. Electrical connections from IC die 120 are not shown, but in some packages can be bond wires, or in flip-chip packages be solder bumps; die-attach epoxy or other means to attach die 120 to package substrate or lead frame 1310 is also not shown. Cover 1330 provides a protective layer between die 120 and the ambient, and in various embodiments may be an encapsulant such as molded plastic or glob top epoxy, or a lid with or without a space between cover 1330 and die 120.

FIG. 13B shows a cross-section of a power switch 100 in which a power switch controller die 2120 is co-packaged with power device 150 in a multi-chip package or MCM. As previously discussed, different ways from the examples shown here to partition the components of power switch 100 onto multiple dice may be useful in various applications, for example, integration of driver 117 and/or an emulation device 160 into the same package as power device 150, without departing from the spirit and scope of the present invention. Finally, FIG. 13C shows a cross-sectional view of a power switch controller 2100 implemented as a packaged power switch controller IC die 2120, which can be connected to a separately-packaged power device 150 to construct a power switch 100.

While the present invention has been particularly shown and described in detail in the foregoing specification with reference to preferred embodiments thereof, it will be evident that various modifications and changes may be made thereto without departing from the broader spirit and scope of the invention as set forth in the appended claims. For example, different combinations of the functional blocks may be integrated or co-packaged to optimize power handling or convenient integration into various systems. Additional protection or power management features or programming inputs can be implemented to increase the versatility or enhance performance of power switches for specific applications. Components and conventional connections not explicitly drawn or described may be used in implementing various embodiments without departing from the scope of the invention.

Other applications of these techniques will also be apparent, and therefore the scope of the invention is much broader than the few specific examples described herein. Alternative embodiments of the devices, systems, and methods set forth herein may find application in low-power terrestrial handheld devices, high-reliability redundant data storage and servers, and radiation-hardened space systems, among other applications. The specification and drawings are, accordingly, to be regarded in an illustrative rather than a restrictive sense.

I claim:

1. A power switch having off state indication for use in coordinating a system of power switches, the power switch comprising:
    a power device having a control input, a supply input, and an output, that forms a connection between the supply input and the output when the power device is turned on by the control input;
    a gate control circuit accepting an on/off command signal and generating a drive signal connected to the power device control input to turn the power device on and off in response to the command signal;
    a decision circuit configured to produce an OFF signal that is active when the power device is fully off; and an OFF output driven by the OFF signal and available to the system, whereby another power switch in the system of power switches can be configured to turn on only when the OFF signal is active, facilitating break-before-make operation.

2. The power switch of claim 1, wherein the power device is integrated into a package together with the gate control circuit and the decision circuit.

3. The power switch of claim 2, wherein the power device, gate control circuit, and decision circuit are all fabricated on a single semiconductor substrate.

4. The power switch of claim 1, wherein the gate control circuit also accepts one or more enable signals and is configured to require all enable signals to be active in order to turn on the power device.

5. The power switch of claim 1, wherein the decision circuit accepts a sense signal indicating the on/off state of the power device.

6. The power switch of claim 5, wherein the power device is a metal-oxide-semiconductor transistor having a gate, a source, and a drain, the gate is the control input and the sense signal is derived from a measurement of the gate-source voltage.

7. The power switch of claim 5, wherein the decision circuit further comprises a latch accepting both the sense signal and a request signal derived from the command signal, the latch configured to force the OFF signal inactive immediately when it receives a request signal to turn on the power device, and to keep the OFF signal inactive until the sense signal indicates that the power device has turned off fully.

8. The power switch of claim 1, wherein the decision circuit accepts a sense signal indicating the state of an emulation device that is controlled by the drive signal and configured to mirror the state of the power device.

9. The power switch of claim 8, wherein the decision circuit further comprises a latch accepting both the sense signal and a request signal derived from the command signal, the latch configured to force the OFF signal inactive immediately when it receives a request signal to turn on the power device, and to keep the OFF signal inactive until the sense signal from the emulation device indicates that the power device has turned off fully.

10. The power switch of claim 1, wherein the decision circuit contains a time delay element that is triggered by a command to turn off the power device, configured such that the decision circuit produces an active OFF signal after a delay selected to ensure that the power device has turned off fully.

11. The power switch of claim 1, wherein the decision circuit comprises a modular redundant decision circuit, in which the outputs of multiple redundant decision circuits are majority voted to produce the OFF signal.

12. The power switch of claim 4, further comprising fault logic that accepts one or more fault input signals indicating whether a fault condition is detected, and that generates a fault enable signal that is active only if no fault has been detected and that is connected to an enable input on the gate control circuit, whereby the power device may be turned on only in the absence of a fault.

13. A coordinated system of power switches connecting at least one power supply to at least one load, comprising:
a plurality of switches, each comprising
a power device that forms a connection between a power supply and a load and that can be turned on and off between a low-impedance on state and a high-impedance off state by a drive signal,
a gate control circuit that produces a drive signal to turn the power device on and off, having a command input accepting an on/off command signal and an enable input accepting an enable signal, configured to require the enable signal to be active in order to turn on the power device, and
a decision circuit that generates an OFF signal that is active only when the power device is fully in the high-impedance off state;
wherein the OFF signal generated by each switch is connected to the enable inputs of all the other switches through logic configured to produce an active enable signal at a switch only when the OFF signals from all other switches are active,
whereby it is ensured that only one switch at a time forms a low-impedance connection between a power supply and a load.

14. The system of claim 13, wherein two or more of the switches connect different power supplies to the same load.

15. The system of claim 13, wherein two or more of the switches connect the same power supply to different loads.

16. The system of claim 13, wherein at least one of the switches further comprises fault logic that prevents that switch from turning on when a fault has been detected.

17. The system of claim 13, wherein at least one of the switches comprises a bank of switches connected in parallel between a shared power supply and a shared load, all switches in the bank controlled by the same command signal and accepting the same enable signal so that they turn on and off at the same time, the OFF signals from all switches in the bank combined using logical conjunction to generate a single bank OFF signal that is active only when all switches in the bank are fully in the high-impedance off state.

18. A method of coordinating a system of power switches comprising:
providing a plurality of switches, each comprising a power device forming a controllable connection between a power supply and a load, each capable of accepting a command to turn the power device on or off, and each generating an OFF signal that is TRUE only when the power device is fully off;
commanding all of the switches to turn off;
waiting until the OFF signals from all of the switches are TRUE;
when at least one of the switches receives a command to turn on, picking a first switch from among those switches that have received commands to turn on and setting the OFF signal from the first switch to FALSE;
turning on the power device in the first switch;
keeping the first switch on until it receives a command to turn off; and
returning to the step of commanding all of the switches to turn off,
whereby only one of the plurality of switches at a time forms a low-impedance connection between a power supply and a load.

19. The method of claim 18, wherein each switch further accepts an enable signal that is derived from logical conjunction of the OFF signals generated by all the other switches in the system, such that all the other OFF signals must be TRUE in order to turn the power device on.

20. The method of claim 18, wherein the system has a capability to detect a fault at one or more of the plurality of switches, and the method further comprises a step of checking for a fault after a command is received to turn on at least one of the switches, and returning to the step of commanding all switches to turn off if there is a fault, otherwise proceeding to the step of picking a first switch to turn on, and the step of keeping the first switch on further comprises returning to the step of commanding all switches to turn off if there is a fault, otherwise keeping the first switch on until it receives a command to turn off.

21. A power switch controller for a power device having a control input, a supply input, and an output, the controller having an off state indication for use in coordinating a system of power switches and comprising:
   a gate control circuit accepting an on/off command signal and configured to generate a drive signal at an output that can be connected to the control input of the power device to turn the power device on and off in response to the command signal;
   a decision circuit configured to produce an OFF signal that is active only when the power device is fully off; and
   an OFF output driven by the OFF signal and available to the system,
   whereby another power switch in the system of power switches can be configured to turn on only when the OFF signal is active, facilitating break-before-make operation.

22. The power switch controller of claim 21, wherein the gate control circuit also accepts one or more enable signals and is configured to require all enable signals to be active in order to turn on the power device.

23. The power switch controller of claim 21, wherein the decision circuit accepts a sense signal indicating the on/off state of the power device.

24. The power switch controller of claim 23, wherein the decision circuit further comprises a latch accepting both the sense signal and a request signal derived from the command signal, the latch configured to force the OFF signal inactive immediately when it receives a request signal to turn on the power device, and to keep the OFF signal inactive until the sense signal indicates that the power device has turned off fully.

25. The power switch controller of claim 21, wherein the decision circuit contains a time delay element that is triggered by a command to turn off the power device, configured such that the decision circuit produces an active OFF signal after a delay selected to ensure that the power device has turned off fully.

26. The power switch controller of claim 21, wherein the decision circuit comprises a modular redundant decision circuit, in which the outputs of multiple redundant decision circuits are majority voted to produce the OFF signal.

27. The power switch controller of claim 22, further comprising a coordinator circuit that accepts input OFF signals from a plurality of other power switch controllers and generates an enable signal connected to the gate control circuit, requiring all of the input OFF signals to be active in order for the enable signal to be active.

28. The power switch controller of claim 22, further comprising fault logic that accepts one or more fault signals indicating whether a fault condition is detected, and that generates a fault enable signal that is active only if no fault has been detected and that is connected to an enable input on the gate control circuit, whereby the power device may be turned on only in the absence of a fault.

29. The power switch controller of claim 28, further comprising circuitry configured to generate a fault signal that is active when an over-current condition at the power device output has been detected, so that the fault logic generates an inactive fault enable signal, thereby causing the gate control circuit to generate a drive signal that turns the power device off.

30. The power switch controller of claim 28, wherein the fault logic is configured to latch a detected fault condition, and after latching a fault must be reset by a fault clear signal in order to generate an active fault enable signal.

* * * * *